US009722007B2

(12) United States Patent
Kim et al.

(10) Patent No.: US 9,722,007 B2
(45) Date of Patent: Aug. 1, 2017

(54) LIGHT EMITTING DISPLAY DEVICE

(71) Applicant: SAMSUNG DISPLAY CO., LTD., Yongin, Gyeonggi-Do (KR)

(72) Inventors: Yool Guk Kim, Anyang-si (KR); Sung Woong Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 62 days.

(21) Appl. No.: 14/815,743

(22) Filed: Jul. 31, 2015

(65) Prior Publication Data

US 2016/0190213 A1    Jun. 30, 2016

(30) Foreign Application Priority Data

Dec. 31, 2014  (KR) .................... 10-2014-0195544

(51) Int. Cl.
*H01L 27/32*    (2006.01)

(52) U.S. Cl.
CPC ........ *H01L 27/326* (2013.01); *H01L 27/3246* (2013.01); *H01L 27/3258* (2013.01); *H01L 2251/558* (2013.01)

(58) Field of Classification Search
None
See application file for complete search history.

(56) References Cited

U.S. PATENT DOCUMENTS

| 2002/0047567 | A1* | 4/2002 | Fujita | .................. H01L 27/3248 |
| | | | | 315/169.3 |
| 2007/0257253 | A1* | 11/2007 | Im | ....................... H01L 27/3246 |
| | | | | 257/40 |
| 2011/0215305 | A1* | 9/2011 | Kim | ....................... H01L 51/52 |
| | | | | 257/40 |

(Continued)

FOREIGN PATENT DOCUMENTS

| JP | 4042409 B2 | 2/2008 |
| JP | 5214174 B2 | 6/2013 |

(Continued)

OTHER PUBLICATIONS

Patent Abstracts of Japan Publication No. 2002-252083, dated Sep. 6, 2002, for JP 4042409 B2, 1 page.

(Continued)

*Primary Examiner* — Lex Malsawma
(74) *Attorney, Agent, or Firm* — Lewis Roca Rothgerber Christie LLP

(57) ABSTRACT

Provided is a light emitting display device.
The emitting display device comprises: a substrate including a plurality of pixels which are arranged in a first direction and a second direction that crosses the first direction, the plurality of pixels comprising a first main pixel block and a second main pixel block; a planarization pattern arranged on the substrate; a first electrode on the planarization pattern for each of the plurality of pixels; a pixel defining layer partitioning the respective pixels on the substrate and having an opening for exposing the first electrode; an organic layer on (Continued)

the first electrode; and a second electrode on the organic layer, wherein a thickness of the planarization pattern of the pixel in the second main pixel block is larger than a thickness of the planarization pattern of the pixel in the first main pixel block.

19 Claims, 22 Drawing Sheets

(56) References Cited

U.S. PATENT DOCUMENTS

| | | | | |
|---|---|---|---|---|
| 2012/0001185 | A1* | 1/2012 | Lee | H01L 27/3267 257/59 |
| 2014/0239265 | A1* | 8/2014 | Kim | H01L 27/3246 257/40 |
| 2014/0239266 | A1* | 8/2014 | Kim | H01L 51/0013 257/40 |
| 2014/0367655 | A1* | 12/2014 | Takii | H01L 51/56 257/40 |

FOREIGN PATENT DOCUMENTS

| | | |
|---|---|---|
| JP | 2014-013703 A | 1/2014 |
| KR | 10-2011-0106081 A | 9/2011 |
| KR | 10-2014-0085009 A | 7/2014 |

OTHER PUBLICATIONS

Patent Abstracts of Japan Publication No. 2008-305602, dated Dec. 18, 2008, for JP 5214174 B2, 1 page.

\* cited by examiner

LIGHT EMITTING DISPLAY DEVICE

CROSS-REFERENCE TO RELATED APPLICATION

This application claims priority to and the benefit of Korean Patent Application No. 10-2014-0195544, filed on Dec. 31, 2014 in the Korean Intellectual Property Office, the disclosure of which is incorporated herein in its entirety by reference.

BACKGROUND

1. Field

The present invention relates to a light emitting display device.

2. Description of the Prior Art

Among light emitting display devices, an organic light emitting display device is a self-luminous display device which has the features of a wide viewing angle, a superior contrast, and a high response speed, and thus has been in the spotlight as the next-generation display device.

An organic light emitting display device has an organic light emitting layer that is made of an organic light emitting material disposed between an anode electrode and a cathode electrode. When anode and cathode voltages are respectively applied to these electrodes, holes injected from the anode electrode move to the organic light emitting layer through a hole injection layer and a hole transport layer, and electrons move to the organic light emitting layer through an electron injection layer and an electron transport layer. In the organic light emitting layer, the electrons and the holes are recombined, and through this recombination, excitons are generated. As the generated excitons transition from an excited state to a ground state, the organic light emitting layer emits light to display an image.

Such an organic light emitting display device includes a pixel defining layer having an opening for exposing an anode electrode that is formed on each of pixels which are arranged on a substrate in a matrix form, and a hole injection layer, a hole transport layer, an organic light emitting layer, an electron transport layer, an electron injection layer, and a cathode electrode are formed on the anode electrode that is exposed through the opening of the pixel defining layer. The hole injection layer, the hole transport layer, and the organic light emitting layer may be formed in the form of a thin film through discharging of ink into the opening of the pixel defining layer through a discharge head having at least one nozzle using an inkjet printing method or a nozzle printing method.

SUMMARY

In discharging the ink into the opening of the pixel defining layer, the ink may be discharged onto respective pixels at different ink discharge times, and this may cause the ink discharged onto the respective pixels to be dried at different times. For example, in the case where the substrate includes a first pixel onto which the ink is discharged at a first time point and a second pixel onto which the ink is discharged at a second time point that is later than the first time point, the drying time of the ink that is discharged onto the first pixel may be longer than the drying time of the ink that is discharged onto the second pixel.

When the pixels have different ink drying times as described above, the thin film that is formed through drying of the ink discharged onto the respective pixels may have different thicknesses. The light emission characteristics of the organic light emitting display device may become non-uniform and deteriorate the display quality.

Accordingly, an embodiment of the present invention provides a light emitting display device, which can improve the display quality through making respective pixels have uniform light emission characteristics.

Additional features and aspects of the invention will be set forth in part in the description which follows and in part will become apparent to those having ordinary skill in the art upon examination of the following or may be learned from practice of the invention.

In one aspect of the present invention, there is provided a light emitting display device comprising: a substrate including a plurality of pixels arranged in a first direction and a second direction that crosses the first direction, the plurality of pixels including a first main pixel block and a second main pixel block; a planarization pattern arranged on the substrate; a first electrode on the planarization pattern for each of the plurality of pixels; a pixel defining layer partitioning the respective pixels on the substrate and having an opening for exposing the first electrode; an organic layer on the first electrode; and a second electrode on the organic layer, wherein a thickness of the planarization pattern of the pixel in the second main pixel block is larger than a thickness of the planarization pattern of the pixel in the first main pixel block.

Heights measured from an upper surface of the substrate to an upper surface of the pixel defining layer may be equal to each other in the pixel in the first main pixel block and the pixel in the second main pixel block.

A depth of the opening of the pixel defining layer in the pixel in the second main pixel block may be lower than a depth of the opening of the pixel defining layer in the pixel in the first main pixel block.

A position of the organic layer in the pixel in the second main pixel block may be higher than a position of the organic layer in the pixel in the first main pixel block.

The planarization pattern may comprise a photosensitive material.

The plurality of pixels may include a plurality of row groups that are arranged in the second direction, and the first main pixel block may include a first number of successive pixel row groups, and the second main pixel block includes a second number of successive pixel row groups.

The first number may be equal to the second number.

The second number may be smaller than the first number.

The first main pixel block may comprise a first sub-pixel block that includes a third number of successive pixel column groups among the first number of successive pixel row groups and a second sub-pixel block that includes a fourth number of successive pixel column groups among the first number of successive pixel row groups.

The third number may be equal to the fourth number.

The fourth number may be smaller than the third number.

The second main pixel block may comprise a third sub-pixel block that includes a fifth number of successive pixel column groups among the second number of successive pixel row groups and a fourth sub-pixel block that includes a sixth number of successive pixel column groups among the second number of successive pixel row groups.

The fifth number may be equal to the sixth number.

The sixth number may be smaller than the fifth number.

In another aspect of the present invention, there is provided a light emitting display device comprising: a substrate including a plurality of pixels which are arranged in a first direction and a second direction that crosses the first direction, the plurality of pixels including a first main pixel block and a second main pixel block; a planarization pattern arranged on the substrate; a first electrode on the planarization pattern for each of the plurality of pixels; a pixel defining layer partitioning the respective pixels on the substrate and having an opening for exposing the first electrode; an organic layer on the first electrode; and a second electrode on the organic layer, wherein an angle that is between an inner wall of the opening of the pixel defining layer of the pixel in the second main pixel block and the first electrode is larger than an angle that is between the inner wall of the opening of the pixel defining layer of the pixel in the first main pixel block and the first electrode.

Heights measured from an upper surface of the substrate to an upper surface of the pixel defining layer may be equal to each other in the pixel in the first main pixel block and the pixel in the second main pixel block.

Thicknesses of the planarization pattern may be equal to each other in the pixel in the first main pixel block and the pixel in the second main pixel block.

An area of an upper portion of the opening of the pixel defining layer in the pixel in the second main pixel block may be larger than an area of an upper portion of the opening of the pixel defining layer in the pixel in the first main pixel block.

The pixel defining layer may comprise a photosensitive material.

The plurality of pixels may include a plurality of row groups that are arranged in the second direction, and the first main pixel block includes a first number of successive pixel row groups, and the second main pixel block includes a second number of successive pixel row groups.

Because the light emitting display device according to an embodiment of the present invention includes the planarization pattern having different thicknesses for the main pixel blocks, openings of the pixel defining layer for the respective main pixel blocks may have different depths.

According to the light emitting display device according to an embodiment of the present invention, because the surface areas of the ink that is discharged into the openings of the pixel defining layer are different from each other for the respective main pixel blocks, the drying rates of the ink are kept equal, substantially equal, or similar to each other for the respective main pixel blocks even when the ink drying times are different from each other due to the different ink discharge times for the respective main pixel blocks.

According to the light emitting display device according to an embodiment of the present invention, because the thickness of the organic layer that is formed through drying of the ink for the respective pixels becomes uniform, the light emission characteristics also become uniform, and thus the display quality of the light emitting display device is improved.

Embodiments of the present invention are not limited to the contents as exemplified above, but further various features are included in the description that follows.

BRIEF DESCRIPTION OF THE DRAWINGS

The above and other features and aspects of the present invention will be more apparent from the following detailed description taken in conjunction with the accompanying drawings, in which.

DETAILED DESCRIPTION

Figure 1:
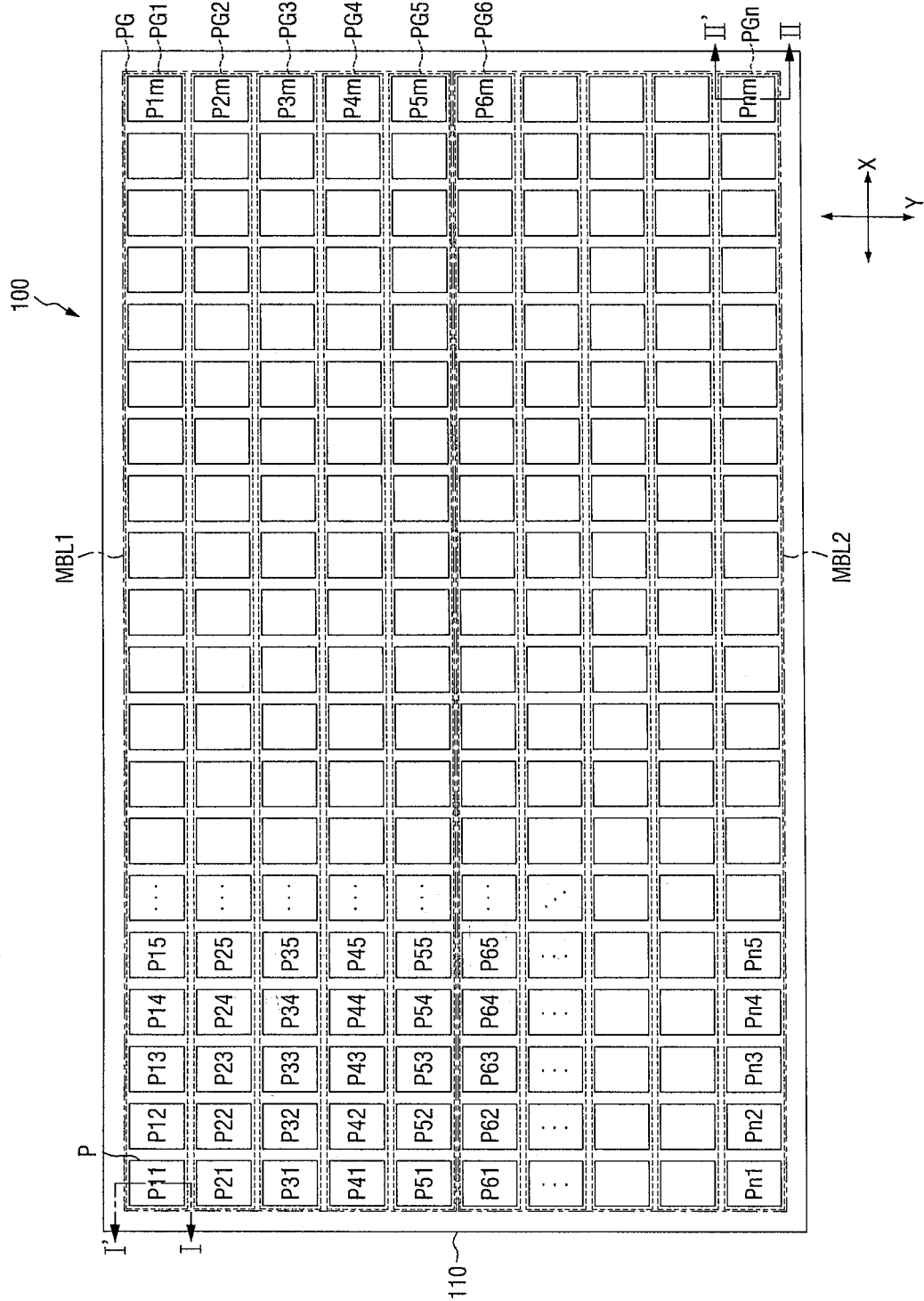
FIG. 1 is a schematic cross-sectional view illustrating pixels of a light emitting display device according to an embodiment of the present invention.

Aspects and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims and their equivalents.

It will also be understood that when a layer is referred to as being "on" another layer or substrate, it can be directly on the other layer or substrate, or intervening layers may also be present. The same reference numbers indicate the same components throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it will also be understood that when one element, component, region, layer and/or section is referred to as being "between" two elements, components, regions, layers, and/or sections, it can be the only element, component, region, layer and/or section between the two elements, components, regions, layers, and/or sections, or one or more intervening elements, components, regions, layers, and/or sections may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "include," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent to" another element or layer, it can be "directly on," "directly connected to," "directly coupled to," "directly connected with," "directly coupled with," or "directly adjacent to" the other element or layer, or one or more intervening elements or layers may be present. When an element or layer is referred to as being "directly on," "directly connected to," "directly coupled to," "directly connected with," "directly coupled with," or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Hereinafter, exemplary embodiments of the present invention will be described with reference to the accompanying drawings.

FIG. 1 is a schematic plan view illustrating pixels of a light emitting display device according to an embodiment of the present invention.

Referring to FIG. 1, a light emitting display device 100 according to an embodiment of the present invention includes a plurality of pixels P arranged on a substrate 110 in the form of an n×m (where, n and m are natural numbers) matrix, i.e., in a first direction X and a second direction Y that crosses the first direction X.

The plurality of pixels P may be divided into a plurality of row groups PG arranged in the second direction Y on the substrate 110. The plurality of row groups PG may include first to n-th pixel row groups PG1 to PGn, and may be divided into a plurality of main pixel blocks, for example, a first main pixel block MBL1 and a second main pixel block MBL2.

The first main pixel block MBL1 may include, for example, first to fifth pixel row groups PG1 (P11 to P1m) to PG5 (P51 to P5m), and the second main pixel block MBL2 may include, for example, sixth to tenth pixel row groups PG6 (P61 to P6m) to PG10 (P101 to P10m) (PGn in FIG. 1).

FIG. 1 illustrates that the plurality of pixels P are arranged in the form of a 10×20 matrix and include 10 row groups, but are not limited thereto. Further, FIG. 1 illustrates that the number of main pixel blocks is 2, but is not limited thereto. Further, FIG. 1 illustrates that a first number of successive pixel row groups that are included in the first main pixel block MBL1 is equal to a second number of successive pixel row groups that are included in the second main pixel block MBL2, but is not limited thereto. For example, the first number may be different from the second number, and for instance, the second number may be smaller than the first number.

Next, the structure of the light emitting display device 100 will be described in detail. In describing the structure of the light emitting display device 100, a pixel portion P that is included in the first main pixel block MBL1 and a pixel portion P that is included in the second main pixel block MBL2 among the plurality of pixels P will be exemplified. Here, the pixel portion P that is included in the first main pixel block MBL1 is exemplified as a pixel portion P11 that is included in the first pixel row group PG1, and the pixel portion P that is included in the second main pixel block MBL2 is exemplified as a pixel portion P1020 (Pnm in FIG. 1) that is included in the tenth pixel row group PG10.

Figure 2:
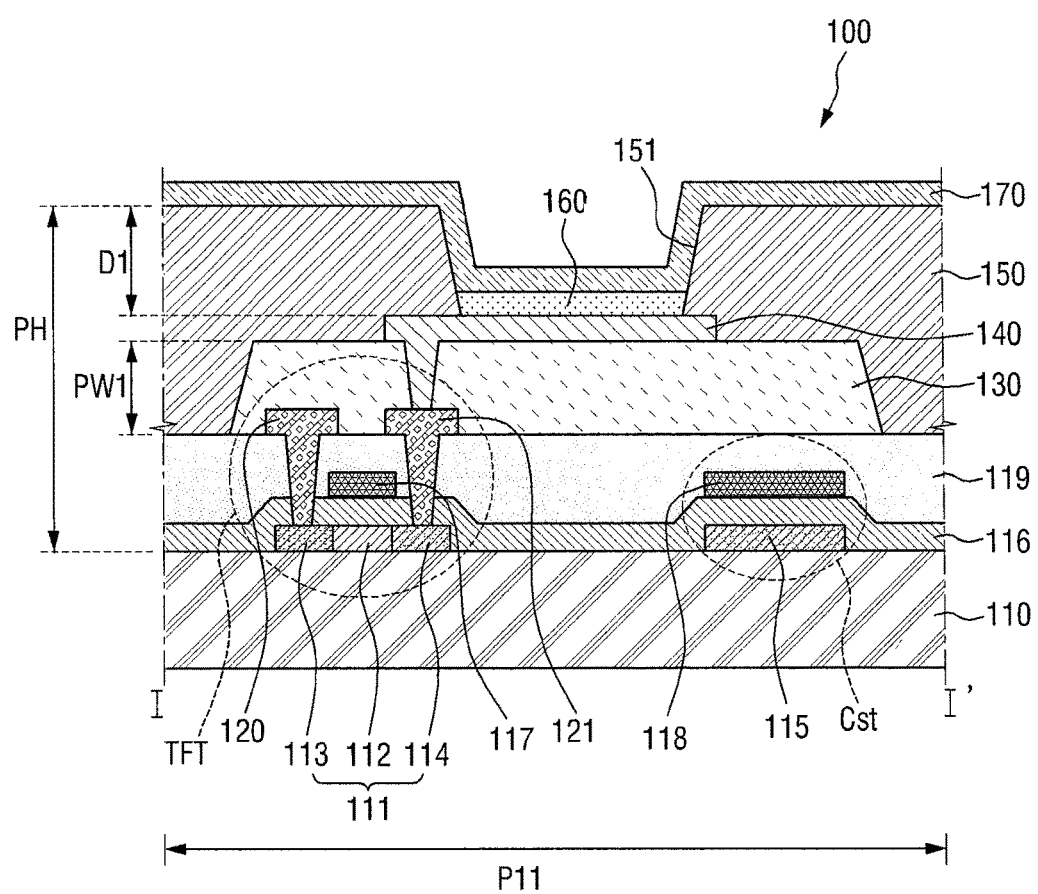
FIG. 2 is a cross-sectional view of a portion that is taken along line I-I' in a pixel that is included in a first main pixel block of FIG. 1.
Figure 3:
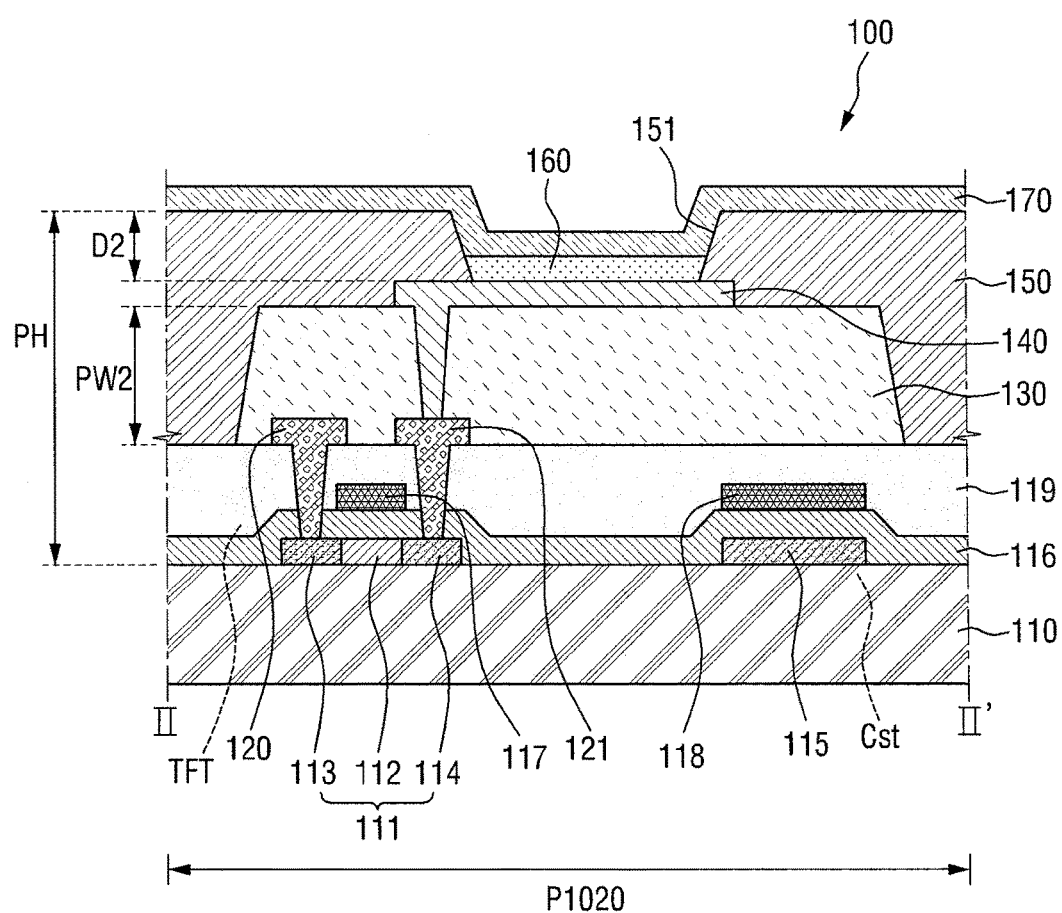
FIG. 3 is a cross-sectional view of a portion that is taken along line II-II' in a pixel that is included in a second main pixel block of FIG. 1.
Figure 4:
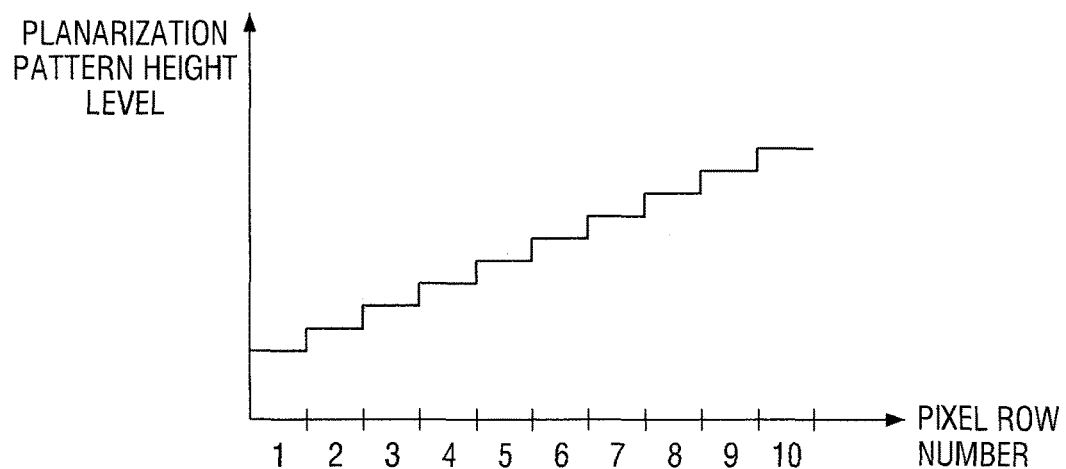
FIGS. 4 through 6 are exemplary diagrams illustrating planarization pattern height levels according to pixel row numbers.
Figure 5:
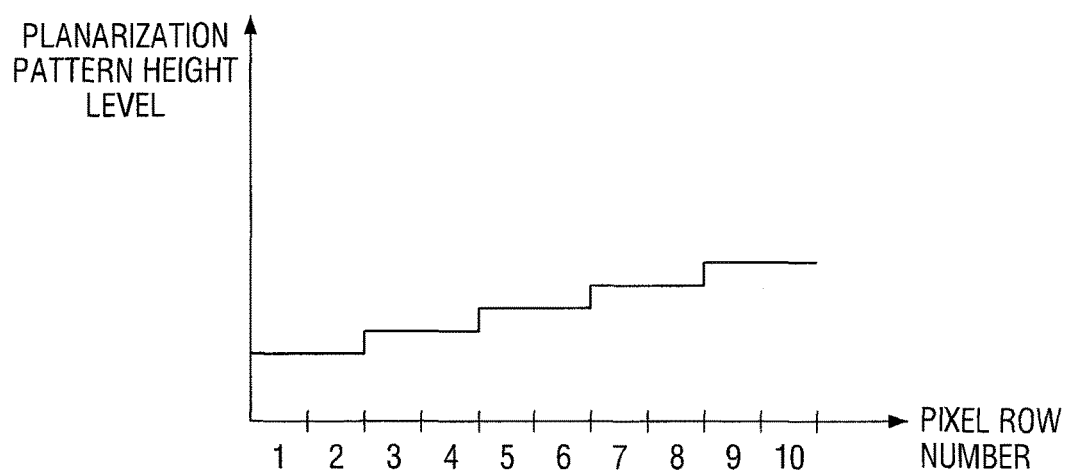
Figure 6:
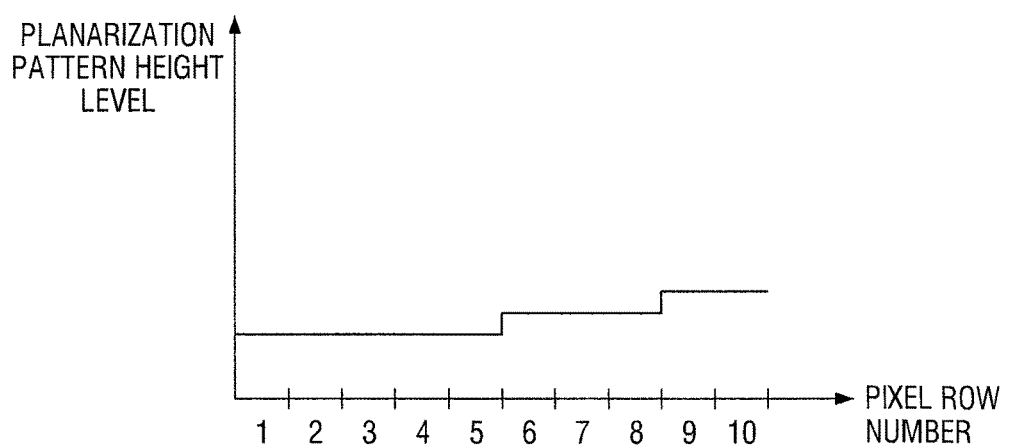

FIG. 2 is a cross-sectional view of a portion that is taken along line I-I' in a pixel that is included in a first main pixel block of FIG. 1, and FIG. 3 is a cross-sectional view of a portion that is taken along line II-II' in a pixel that is included in a second main pixel block of FIG. 1. FIGS. 4 through 6 are exemplary diagrams illustrating planarization pattern height levels according to pixel row numbers.

Referring to FIGS. 2 and 3, the light emitting display device 100 may include a substrate 110, an active layer 111, a lower electrode 115, a gate insulating layer 116, a gate electrode 117, an upper electrode 118, an interlayer insulating layer 119, a source electrode 120, a drain electrode 121, a planarization pattern 130, a first electrode 140, a pixel defining layer 150, an organic layer 160, and a second electrode 170.

The substrate 110 may be a transparent insulating substrate. The insulating substrate may be made of a material, such as glass, quartz, or polymer resin. Examples of the polymer material may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT or TAC), cellulose acetate propionate (CAP), and a combination thereof. In some embodiments, the insulating substrate may be a flexible substrate that is made of a flexible material, such as polyimde (PI).

The substrate 110 includes a plurality of pixels P (e.g., see FIG. 1) that are arranged in first and second directions X and Y (e.g., see FIG. 1). Because the arrangement of the plurality of pixels P (e.g., see FIG. 1) has been described in detail, the duplicate explanation thereof will be omitted.

The active layer 111 may be arranged on the substrate 110, and may include a channel area 112, a source area 113, and a drain area 114 that are positioned on both sides of the channel area 112. The active layer 111 may be formed of silicon, for example, amorphous silicon, or polysilicon, and the source area 113 and the drain area 114 may be doped with p-type or n-type impurities. The active layer 111 may be formed through a photolithography method, but is not limited thereto.

The lower electrode 115 may be arranged on the same or substantially the same layer as the active layer 111 on the substrate 110, and may be formed to be spaced apart from the active layer 111. The lower electrode 115 may be formed of the same or substantially the same material as the source area 113 or the drain area 114. That is, the lower electrode 115 may be formed of silver silicon, and may include p-type or n-type impurities. The lower electrode 115 may be formed through a photolithography method, but is not limited thereto.

The gate insulating layer 116 is formed on the substrate 110 to cover the active layer 111 and the lower electrode 115. The gate insulating layer 116 electrically insulates the gate electrode 117 and the active layer 111 from each other. The gate insulating layer 116 may be made of an insulating material, for example, silicon oxide (SiOx), silicon nitride (SiNx), or metal oxide. The gate insulating layer 116 may be formed through a deposition method, but is not limited thereto.

The gate electrode 117 may be formed on the gate insulating layer 116. The gate electrode 117 may be formed in a position that overlaps the channel area 112 on an upper portion of the channel area 112, i.e., the gate insulating layer 116. The gate electrode 117 may include metal, alloys, metal nitride, conductive metal oxide, or transparent conductive materials. The gate electrode 117 may be formed through a photolithography method, but is not limited thereto.

The upper electrode 118 may be formed on the same or substantially the same layer as the gate electrode 117, and may be formed of the same or substantially the same material as the gate electrode 117. The upper electrode 118 may be formed in a position that overlaps the lower electrode 115 on an upper portion of the lower electrode 115, i.e., the gate insulating layer 116. The upper electrode 118 forms a storage capacitor Cst together with the lower electrode 115 and the gate insulating layer 116. A voltage that is applied to the gate electrode 117 of a thin film transistor TFT is charged in the storage capacitor Cst. The upper electrode 118 may be formed through a photolithography method, but is not limited thereto.

The interlayer insulating layer 119 may be formed on the gate insulating layer 116 to cover the gate electrode 117 and the upper electrode 118. The interlayer insulating layer 119 may be made of silicon compounds. For example, the interlayer insulating layer 119 may include silicon oxide, silicon nitride, silicon oxynitride, silicon carbonitride, or silicon oxycarbonate. The interlayer insulating layer 119 may serve to insulate the gate electrode 117 from the source electrode 120 and the drain electrode 121. The interlayer insulating layer 119 may be formed through a deposition method, but is not limited thereto.

The source electrode 120 and the drain electrode 121 may be formed on the interlayer insulating layer 119. The source electrode 120 extends through the interlayer insulating layer 119 and the gate insulating layer 116 to be connected to the source area 113 of the active layer 111, and the drain electrode 121 extends through the interlayer insulating layer 119 and the gate insulating layer 116 to be connected to the drain area 114.

The source electrode 120 and the drain electrode 121 may include metal, alloys metal nitride, conductive metal oxide, or transparent conductive materials. For example, the source electrode 120 and the drain electrode 121 may be made of aluminum, an aluminum-containing alloy, aluminum nitride, silver, a silver-containing alloy, tungsten, tungsten nitride, copper, a copper-containing alloy, nickel, chrome, chrome nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, or indium zinc oxide. The source electrode 120 and the drain electrode 121 may be formed through a photolithography method, but is not limited thereto.

The source electrode 120 and the drain electrode 121 form a thin film transistor TFT together with the active layer 111 and the gate electrode 117. The thin film transistor TFT may be a driving transistor which supplies current that corresponds to a voltage that is applied to the gate electrode 117 to a light emitting diode (a portion composed of 140, 160, and 170). Although not illustrated, the thin film transistor TFT may be connected to a switching transistor. The switching transistor applies a voltage which corresponds to a data signal that is supplied through a data line (not illustrated) to the thin film transistor TFT in response to a gate signal that is supplied through a gate line (not illustrated).

The planarization pattern 130 may be formed on the interlayer insulating layer 119 to cover the source electrode 120 and the drain electrode 121. The planarization pattern 130 may have a flat surface. The planarization pattern 130 may be arranged in the unit of a pixel P. That is, a boundary portion of adjacent pixels P (e.g., see FIG. 1) and a gap area between adjacent planarization patterns 130 may overlap each other. In some embodiments, the planarization patterns 130 may be integrally formed on the interlayer insulating layer 119.

A first thickness PW1 of the planarization pattern 130 of the pixel P11 may be different from a second thickness PW2 of the planarization pattern 130 of the pixel P1020. For example, the second thickness PW2 of the planarization pattern 130 of the pixel P1020 may be larger than the first thickness PW1 of the planarization pattern 130 of the pixel P11.

The planarization pattern 130 may be formed so that a first depth D1 of an opening 151 of the pixel defining layer 150 of the pixel P11 becomes different from a depth D2 of an opening 151 of the pixel defining layer 150 of the pixel P1020 when the pixel defining layer 150 is formed so that heights PH measured from an upper surface of the substrate 110 to an upper surface of the pixel defining layer 150 in the pixels P11 and P1020 are equal or substantially equal to each other. For example, the planarization pattern 130 may be formed so that the depth D2 of the opening 151 of the pixel defining layer 150 of the pixel P1020 becomes lower than the first depth D1 of the opening 151 of the pixel defining layer 150 of the pixel P11 when the pixel defining layer 150 is formed so that the heights PH measured from the substrate 110 to the upper surface of the pixel defining layer 150 in the pixels P11 and P1020 are equal or substantially equal to each other.

The planarization pattern 130 having the different thicknesses in the pixels P11 and P1020 may be formed through a photolithography process using a half-tone mask. In some embodiments, the planarization pattern 130 having the different thicknesses in the pixels P11 and P1020 may be formed through a photolithography process using a digital exposure unit that facilitates adjustment of the exposure value without a mask. The planarization pattern 130 may be formed to include a photosensitive material, for example, a negative type photosensitive material.

As described above, when the first depth D1 of the opening 151 of the pixel defining layer 150 of the pixel P11 is different from the depth D2 of the opening 151 of the pixel defining layer 150 of the pixel P1020, the surface area of ink that is discharged into the opening 151 of the pixel defining layer 150 of the pixel P11 may be different from the surface area of ink that is discharged into the opening 151 of the pixel defining layer 150 of the pixel P1020 when a thin film is formed through discharging of the ink into the opening 151 of the pixel defining layer 150. The drying speed of the ink that is discharged into the opening 151 of the pixel defining layer 150 of the pixel P11 may be different from the drying speed of the ink that is discharged into the opening 151 of the pixel defining layer 150 of the pixel P1020. For example, when the depth D2 of the opening 151 of the pixel defining layer 150 of the pixel P1020 that is included in the second main pixel block MBL2 is lower than the first depth D1 of the opening 151 of the pixel defining layer 150 of the pixel P11 included in the second main pixel block MBL2, the surface area of the ink that is discharged into the opening 151 of the pixel defining layer 150 of the pixel P1020 may become larger than the surface area of the ink that is discharged into the opening 151 of the pixel defining layer 150 of the pixel P11 when the thin film is formed through discharging of the ink into the opening 151 of the pixel defining layer 150. The drying speed of the ink that is discharged into the opening 151 of the pixel defining layer 150 of the pixel P1020 may be higher than the drying speed of the ink that is discharged into the opening 151 of the pixel defining layer 150 of the pixel P11.

Accordingly, in the case where the time point when the ink is discharged onto the pixel P11 is different from the time point when the ink is discharged onto the pixel P1020, the drying rate of the ink (actually, the drying rate of a solvent included in the ink) that is discharged onto the pixel P11 for a time (e.g., a predetermined time) may be adjusted to be equal, substantially equal, or similar to the drying rate of the ink that is discharged onto the pixel P1020 through differently adjusting the drying speed of the ink that is discharged onto the pixel P11 and the drying speed of the ink that is discharged onto the pixel P1020. The time (e.g., the predetermined time) may be time that is measured from a time point when the ink is first discharged into the opening 151 of the pixel defining layer 150 using an inkjet or nozzle printing method to a time point just before a separate drying process is performed in a vacuum atmosphere through a time point when the ink is finally discharged. For example, when the time point when the ink is discharged onto the pixel P11 is earlier than the time point when the ink is discharged onto the pixel P1020, the drying rate of the ink that is discharged onto the pixel P11 for the time (e.g., the predetermined time) may be adjusted to become equal, substantially equal, or similar to the drying rate of the ink that is discharged onto the pixel P1020 through adjusting the drying speed of the ink that is discharged onto the pixel P1020 to be higher than the drying speed of the ink that is discharged onto the pixel P11. Here, the drying of the ink before the separate drying process may be natural drying.

Accordingly, because the thickness of the thin film (e.g., organic layer 160) that is formed through drying of the ink for the pixels P becomes uniform, the light emission characteristics also become uniform, and thus the display quality of the light emitting display device is improved.

FIG. 1 illustrates that 5 pixel row groups are included in the first main pixel block MBL1 and 5 pixel row groups are included in the second main pixel block MBL2, and it is described that the planarization pattern 130 has two height levels in FIGS. 2 and 3. However, the planarization pattern 130 may have a different number of height levels through differently setting the number of main pixel blocks or the number of pixel row groups that are included in the main pixel blocks.

For example, when the number of main pixel blocks is equal or substantially equal to the number of pixel row groups, the planarization pattern may be formed in a manner that as the pixel row number is increased, the height level of the planarization pattern is also increased as illustrated in FIG. 4. That is, the number of height levels of the planarization pattern may be equal or substantially equal to the number of pixel row groups. In forming the organic layer using an inkjet or nozzle printing method, the drying speed according to the discharge time point of the organic light emitting ink may be minutely adjusted. Here, as the pixel row number becomes larger, the discharge time of the organic light emitting ink may be later in time.

Further, when two or more pixel row groups are included in each of the plurality of main pixel blocks, the planarization pattern may be formed in a manner that as the pixel row number is increased, the height level of the planarization pattern is also increased in the unit of two or more pixel row groups as illustrated in FIG. 5. In this way, the process of forming a planarization pattern may be facilitated. Here, as the pixel row number becomes larger, the discharge time of the organic light emitting ink may be later in time.

Further, when different numbers of pixel row groups are respectively included in the plurality of main pixel blocks, the planarization pattern may be formed in a manner that as the pixel row number is increased and the height level of the planarization pattern is also increased in the unit of irregular numbers of pixel row groups as illustrated in FIG. 6. For example, when the first main pixel block includes first to fifth pixel row groups, the second main pixel block includes sixth to eighth pixel row groups, and the third main pixel block includes ninth and tenth pixel row groups, the planarization pattern may be formed in a manner that the height levels of the planarization pattern are increased in the unit of five pixel row groups, three pixel row groups, and two pixel row groups. In this way, the process of forming a planarization pattern may be facilitated, and the height levels of the planarization pattern may be minutely divided with respect to the main pixel blocks that include pixel row groups of which the drying speeds of the organic light emitting ink are greatly different from each other. Here, as the pixel row number becomes larger, the discharge time of the organic light emitting ink may be later in time. The main pixel block that includes pixel row groups of which the drying speeds of the organic light emitting ink are greatly different from each other may be a main pixel group that includes a small number of pixel row groups.

The first electrode 140 is formed on the substrate 110 for each pixel P (e.g., see FIG. 1). The first electrode 140 may be an anode electrode which receives a signal that is applied to the drain electrode 121 of the thin film transistor TFT and provides holes to the organic layer 160 or a cathode electrode which provides electrons to the organic layer 160. The first electrode 140 may be used as a transparent electrode or a reflective electrode. In the case where the first electrode 140 is used as a transparent electrode, it may be formed of ITO (Indium Tin Oxide), IZO (Indium Zinc Oxide), ZnO (Zinc Oxide), or $In_2O_3$. Further, in the case where the first electrode 140 is used as a reflective electrode, it may be formed by forming a reflective layer that is made of Ag, Mg, Al, Pt, Pd, Au, Ni, Nd, Ir, Cr, or a compound thereof and then forming ITO, IZO, ZnO, or $In_2O_3$ thereon. The first electrode 140 may be formed through a photolithography process, but is not limited thereto.

The pixel defining layer 150 partitions respective pixels P (e.g., see FIG. 1) on the substrate 110, and has the opening 151 for exposing the first electrode 140. Accordingly, the pixel defining layer 150 enables the organic layer 160 to be formed on the first electrode 140 through the opening. The pixel defining layer 150 may be made of an insulating material. For example, the pixel defining layer 150 may be formed to include at least one organic material selected from the group including insulating benzo cyclo butane (BCB), polyimide (PI), poly amide (PA), acryl resin, and phenol resin. As another example, the pixel defining layer 150 may be formed to include an inorganic material, such as silicon nitride. The pixel defining layer 150 may be formed through a photolithography process, but is not limited thereto.

In an embodiment of the present invention, when the organic layer 160 is formed using an inkjet or nozzle printing method, the pixel defining layer 150 may be formed of an insulating material that can make a contact angle of the organic layer 160 against the pixel defining layer 150 become larger than a contact angle of the organic layer 160 against the first electrode 140. For example, the pixel defining layer 150 may be formed of an insulating material that makes the contact angle of the organic layer 160 against the pixel defining layer 150 become equal or substantially equal to or larger than 40°.

The organic layer 160 is formed on the first electrode 140 that is exposed through the opening 151 of the pixel defining layer 150. The organic layer 160 may include an organic light emitting layer that emits light through recombination of holes provided from the first electrode 140 and electrons provided from the second electrode 170. For example, when the holes and the electrons are provided to the organic light emitting layer, they are recombined to form excitons, and as the excitons transition from an excited state to a ground state, the organic light emitting layer emits light.

The organic light emitting layer may be implemented as a red light emitting layer that emits red light, a green light emitting layer that emits green light, and a blue light emitting layer that emits blue light, for each of the pixels P (e.g., see FIG. 1). The organic light emitting layer may be formed of an inorganic material including Se or Zn, or a low-molecular or high-molecular organic material. The organic light emitting layer may be formed using an inkjet or nozzle printing method, but is not limited thereto.

In the case of forming the organic light emitting layer using the inkjet or nozzle printing method, organic light emitting ink that includes solids and a solvent of an organic light emitting material is discharged onto the first electrode 140 that is exposed through the opening 151 of the pixel defining layer 150, and a separate drying process is performed to dry the discharged organic light emitting ink in a vacuum atmosphere.

For example, the organic light emitting layer may be formed by discharging the same or substantially the same amount of organic light emitting ink 160a (in FIG. 11) into the opening 151 of the pixel defining layer 150 of the pixel P11 and then into the opening 151 of the pixel defining layer 150 of the pixel P1020, and then drying the discharged organic light emitting ink through a separate drying process at a vacuum atmosphere. When the depth D2 of the opening 151 of the pixel defining layer 150 of the pixel P1020 is lower than the depth D1 of the opening 151 of the pixel defining layer 150 of the pixel P11, the surface area of the organic light emitting ink 160a (in FIG. 11) that is discharged into the opening 151 of the pixel defining layer 150 of the pixel P1020 may become larger than the surface area of the organic light emitting ink 160a (in FIG. 11) that is discharged into the opening 151 of the pixel defining layer 150 of the pixel P11.

Accordingly, the drying speed of the organic light emitting ink 160a (in FIG. 11) that is discharged into the opening 151 of the pixel defining layer 150 of the pixel P1020 may be higher than the drying speed of the organic light emitting ink 160a (in FIG. 11) that is discharged into the opening 151 of the pixel defining layer 150 of the pixel P11.

Accordingly, even when the organic light emitting ink 160a (in FIG. 11) is discharged into the opening 151 of the pixel defining layer 150 of the pixel P11 in advance that the organic light emitting ink 160a is discharged into the opening 151 of the pixel defining layer 150 of the pixel P1020, the drying rate of the organic light emitting ink 160a (in FIG. 11) that is discharged onto the pixel P11 for a time (e.g., a predetermined time) may be equal, substantially equal, or similar to the drying rate of the organic light emitting ink 160a (in FIG. 11) that is discharged onto the pixel P1020, and thus the organic light emitting layer can be uniformly formed on the first electrode 140 of the pixel P11 and the first electrode 140 of the pixel P1020. The organic light emitting layer may be positioned at different heights on the pixel P11 and the pixel P1020. For example, the organic light emitting layer may be positioned on the pixel P1020 at a higher position than the position of the pixel P11.

The organic layer 160 may further include a hole injection layer and a hole transport layer that are formed between the first electrode 140 and the organic light emitting layer in addition to the organic light emitting layer. The hole injection layer and the hole transport layer may be formed using an inkjet or nozzle printing method, but are not limited thereto. Further, the organic layer 160 may further include an electron injection layer and an electron transport layer that are formed between the organic light emitting layer and the second electrode 170. The electron injection layer and the electron transport layer may be formed using a deposition method, but are not limited thereto. Of course, in the case where the first electrode 140 is a cathode electrode and the second electrode 170 is an anode electrode, the electron injection layer and the electron transport layer may be interposed between the first electrode 140 and the organic light emitting layer, and the hole injection layer and the hole transport layer may be interposed between the organic light emitting layer and the second electrode 170.

The second electrode 170 may be formed on the organic layer 160, and may be a cathode electrode that provides electrons to the organic layer 160 or an anode electrode that provides holes to the organic layer 160. In the same or substantially the same manner as the first electrode 140, the second electrode 170 may be used as a transparent electrode or a reflective electrode. The second electrode 190 may be formed through a deposition process, but is not limited thereto.

Although not illustrated, the light emitting display device 100 may further include an encapsulation substrate that is arranged on an upper portion of the second electrode 170. The encapsulation substrate may be made of an insulating substrate. A spacer may be arranged between the second electrode 170 and the encapsulation substrate on the pixel defining layer 150. In some embodiments of the present invention, the encapsulation substrate may be omitted. An encapsulation layer that is made of an insulating material may cover the entire structure to protect the structure.

As described above, the light emitting display device 100 according to an embodiment of the present invention includes the planarization pattern 130 having different thicknesses for the main pixel blocks, and thus the openings 151 of the pixel defining layer 150 for the respective main pixel blocks may have different depths.

Accordingly, the surface areas of the ink that is discharged into the openings 151 of the pixel defining layer 150 are different from each other for the respective main pixel blocks, and thus the drying rates of the ink are kept equal, substantially equal, or similar to each other for the respective main pixel blocks even when the ink drying times are different from each other due to the different ink discharge times for the respective main pixel blocks.

Accordingly, the thickness of the organic layer 160 that is formed through drying of the ink for the respective pixels becomes uniform, and thus the light emission characteristics also become uniform to improve the display quality of the light emitting display device.

According to an embodiment of the present invention, the division of the plurality of pixels P into the first main pixel block MBL1 and the second main pixel block MBL2 may be caused by the division of the difference between the drying speeds of the ink that is discharged into the opening 151 of the pixel defining layer 150 briefly into two levels for the plurality of pixels P, and the number of main pixel blocks may differ depending on the number of levels into which the difference between the ink drying speeds is divided.

Next, a method for manufacturing a light emitting display device 100 according to an embodiment of the present invention will be described.

FIGS. 7 through 14 are cross-sectional views explaining a method for manufacturing a light emitting display device according to an embodiment of the present invention. In FIGS. 7 through 14, portions of the pixel P11 and the pixel 1020 of FIG. 1 are exemplarily illustrated.

Figure 7:
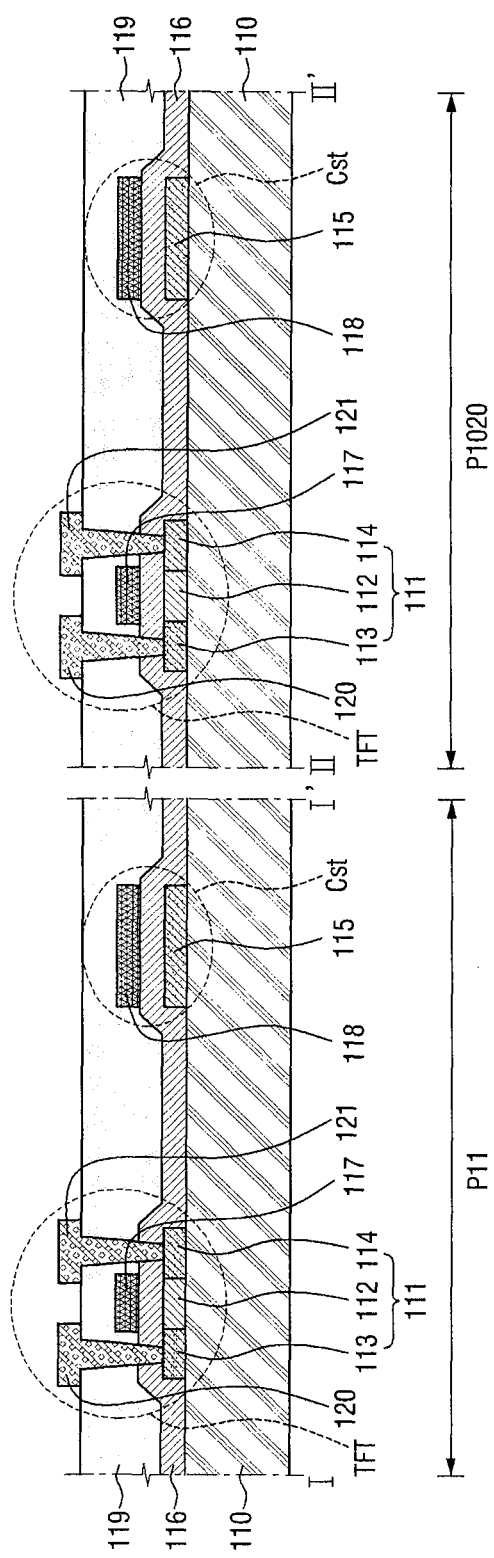
FIGS. 7 through 14 are cross-sectional views explaining a method for manufacturing a light emitting display device according to an embodiment of the present invention.

Referring to FIG. 7, a substrate 110 that includes a thin film transistor TFT and a storage capacitor Cst is prepared. The substrate 110 includes a plurality of pixels P (e.g., see FIG. 1) arranged in a first direction X (e.g., see FIG. 1) and a second direction Y (e.g., see FIG. 1).

The plurality of pixels P (e.g., see FIG. 1) may be divided into a plurality of row groups PG (e.g., see FIG. 1) arranged in the second direction Y on the substrate 110. The plurality of row groups PG (e.g., see FIG. 1) may include first to n-th pixel row groups PG1 to PGn (e.g., see FIG. 1), and may be divided into a plurality of main pixel blocks, for example, a first main pixel block MBL1 (e.g., see FIG. 1) and a second main pixel block MBL2 (e.g., see FIG. 1).

The first main pixel block MBL1 (e.g., see FIG. 1) may include, for example, first to fifth pixel row groups PG1 (P11 to P1m) to PG5 (P51 to P5m) (e.g., see FIG. 1), and the second main pixel block MBL2 (e.g., see FIG. 1) may include, for example, sixth to tenth pixel row groups PG6 (P61 to P6m) (e.g., see FIG. 1) to PG10 (P101 to P10m) (PGn in FIG. 1).

Figure 8:
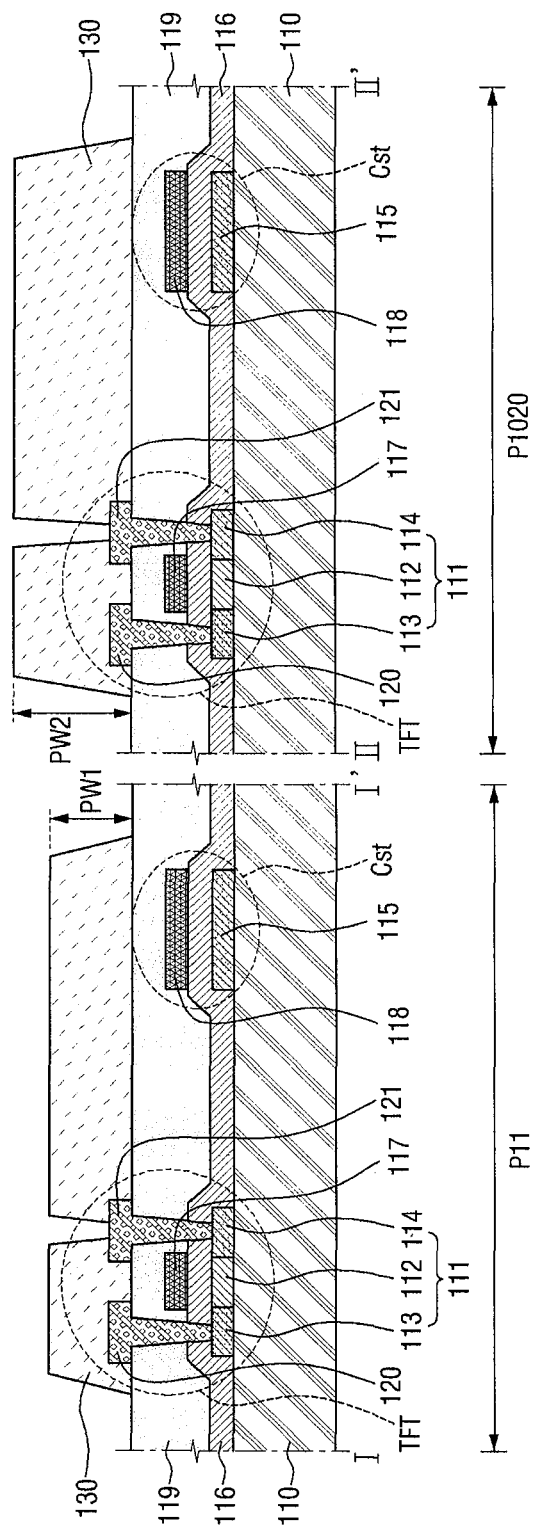

Referring to FIG. 8, a planarization pattern 130 is formed on the substrate 110. The planarization pattern 130 of a pixel P11 that is included in the first main pixel block MBL1 may be formed to have a first thickness PW1, and the planarization pattern 130 of a pixel P1020 that is included in the second main pixel block MBL2 may be formed to have a second thickness PW2 that is different from the first thickness PW1. Here, the second thickness PW2 may be larger than the first thickness PW1. In a portion of the planarization pattern 130 of the pixel P11, which overlaps a drain electrode 121 of the thin film transistor TFT, an opening may be formed to expose the drain electrode 121. Further, in a portion of the planarization pattern 130 of the pixel P1020, which overlaps the drain electrode 121 of the thin film transistor TFT, an opening may be formed to expose the drain electrode 121.

The planarization pattern 130 may be formed through a photolithography process using a half-tone mask or through a photolithography process using a digital exposure unit that facilitates adjustment of the exposure value without a mask. The planarization pattern 130 may be formed to include a photosensitive material, for example, a negative type photosensitive material.

Figure 9:
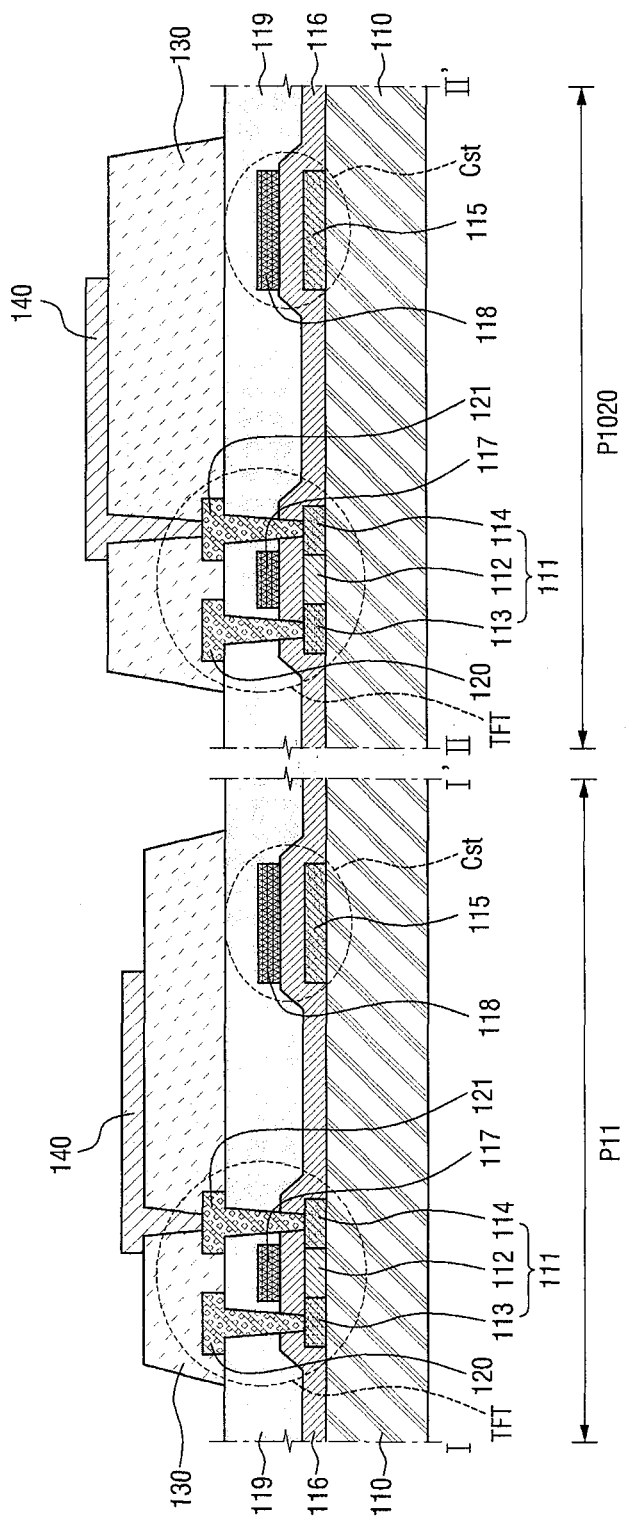

Then, referring to FIG. 9, a first electrode 140 is formed on the planarization pattern 130 for each of the pixels P (e.g., see FIG. 1). The first electrode 140 may be formed by depositing a transparent electrode material or a reflective material on the planarization pattern 130 and patterning the deposited material. The first electrode 140 may be formed to be connected to the drain electrode 121 of the thin film transistor TFT for each of the pixels P (e.g., see FIG. 1).

Figure 10:
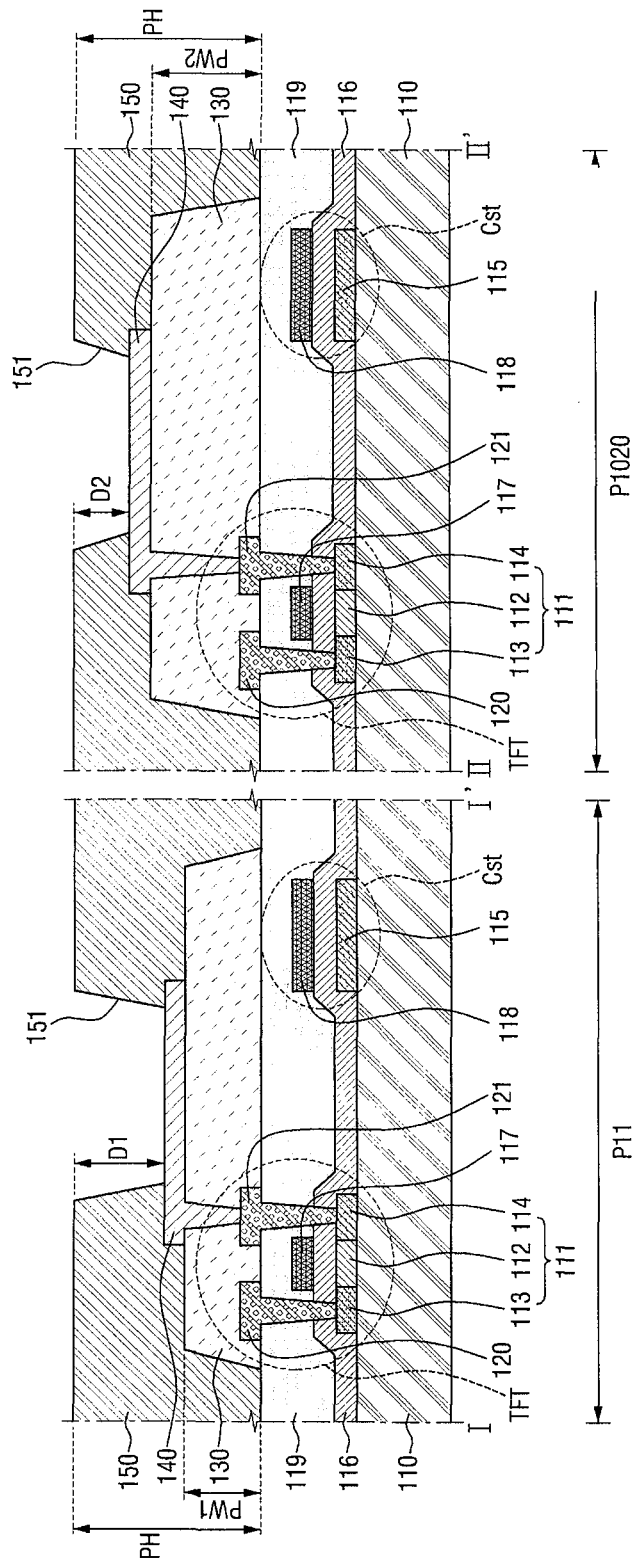

Then, referring to FIG. 10, a pixel defining layer 150, which partitions the respective pixels P (e.g., see FIG. 1) on the substrate 110, and has the opening 151 for exposing the first electrode 140 on an interlayer insulating layer 119, is formed. The pixel defining layer 150 may be formed so that heights PH measured from an upper surface of the substrate 110 to an upper surface of the pixel defining layer 150 in the first main pixel block MBL1 and the second main pixel block MBL2 are equal or substantially equal to each other for each of the pixels P (e.g., see FIG. 1). When the first thickness PW1 of the planarization pattern 130 of the pixel P11 included in the first main pixel block MBL1 is different from the second thickness PW2 of the planarization pattern 130 of the pixel P1020 included in the second main pixel block MBL2, a first depth D1 of the opening 151 of the pixel defining layer 150 of the pixel P11 may be different from a second depth D2 of the opening 151 of the pixel defining layer 150 of the pixel P1020. For example, the depth D2 of the opening 151 of the pixel defining layer 150 of the pixel P1020 may be lower than the first depth D1 of the opening 151 of the pixel defining layer 150 of the pixel P11.

The pixel defining layer 150 may be formed to cover the first electrode 140 through depositing an insulating material on the entire surface of the interlayer insulating layer 119 using a deposition method and patterning the deposited insulating material.

Figure 11:
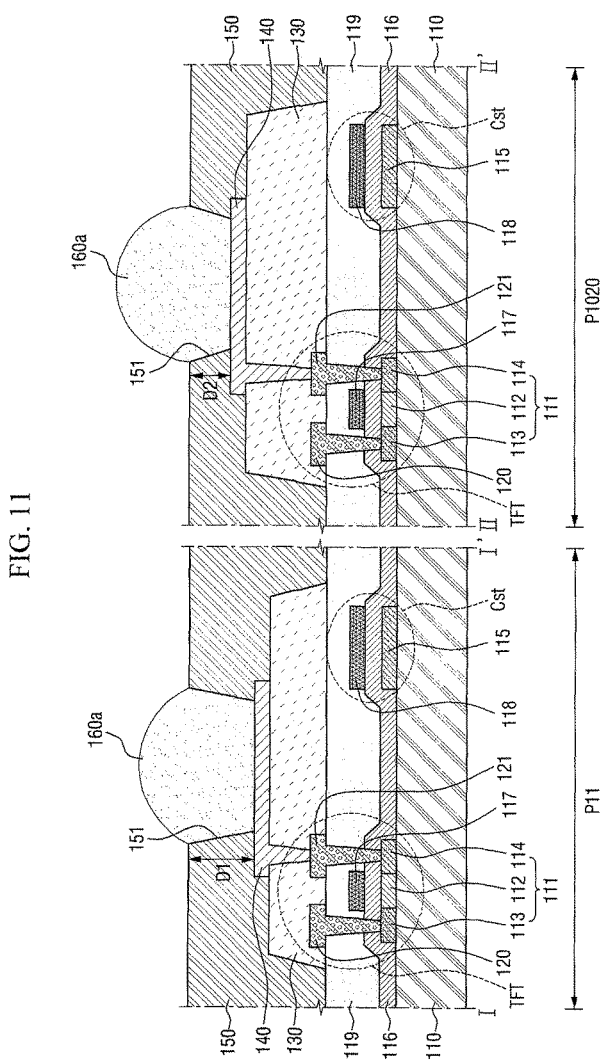
Figure 12:
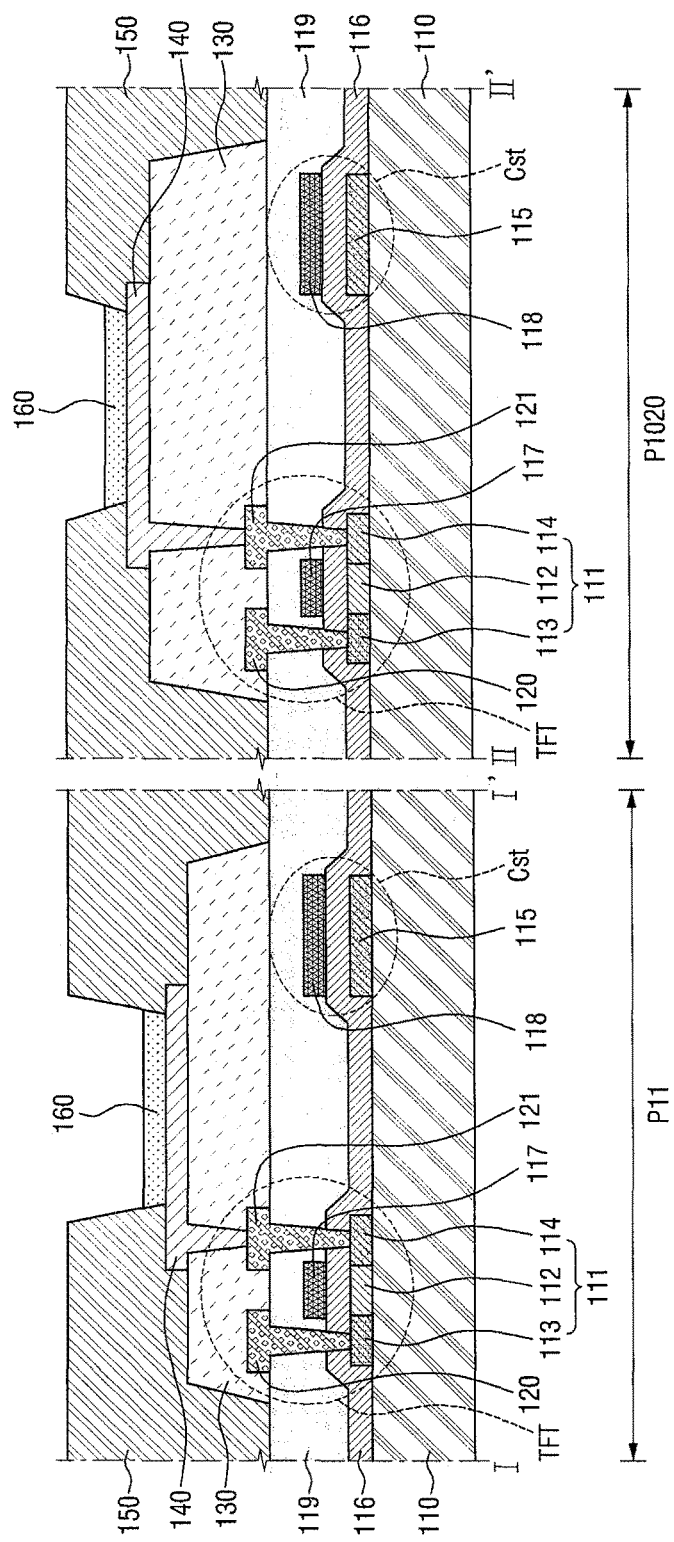

Then, referring to FIGS. 11 and 12, an organic layer 160 is formed on the first electrode 140 that is arranged inside the opening 151 of the pixel defining layer 150 for each of the pixels. P (e.g., see FIG. 1). Here, it is exemplified that the organic layer 160 is an organic light emitting layer.

For example, as illustrated in FIG. 11, an amount of organic material ink (e.g., a predetermined amount of organic material ink), for example, an organic light emitting ink 160a, is discharged into the opening 151 of the pixel defining layer 150 using a discharge head (not illustrated) having a plurality of nozzles. Here, the organic light emitting ink 160a is discharged into the opening 151 of the pixel P11 in advance of the opening 151 of the pixel P1020. When the first depth D1 of the opening 151 of the pixel defining layer 150 of the pixel P11 is different from the second depth D2 of the opening 151 of the pixel defining layer 150 of the pixel P1020, the surface area of the organic light emitting ink 160a that is discharged into the opening 151 of the pixel defining layer 150 of the pixel P11 may be different from the surface area of the organic light emitting ink 160a that is discharged into the opening 151 of the pixel defining layer 150 of the pixel P1020. For example, the surface area of the organic light emitting ink 160a that is discharged into the opening 151 of the pixel defining layer 150 of the pixel P1020 may become larger than the surface area of the organic light emitting ink 160a that is discharged into the opening 151 of the pixel defining layer 150 of the pixel P11. The drying speed of the organic light emitting ink 160a that is discharged into the opening 151 of the pixel defining layer 150 of the pixel P1020 may be higher than the drying speed of the organic light emitting ink 160a that is discharged into the opening 151 of the pixel defining layer 150 of the pixel P11. Accordingly, even when the organic light emitting ink 160a is discharged into the opening 151 of the pixel defining layer 150 of the pixel P11 in advance that the organic light emitting ink 160a is discharged into the opening 151 of the pixel defining layer 150 of the pixel P1020, the drying rate of the organic light emitting ink 160a that is discharged into the opening 151 of the pixel defining layer 150 of the pixel P11 may be equal, substantially equal, or similar to the drying rate of the organic light emitting ink 160a that is discharged into the opening 151 of the pixel defining layer 150 of the pixel P1020.

Accordingly, as illustrated in FIG. 12, the thickness of the organic layer 160 that is formed inside the opening 151 of the pixel defining layer 150 of the pixel P1020 and the thickness of the organic layer 160 that is formed inside the opening 151 of the pixel defining layer 150 of the pixel P11 may become uniform.

Figure 13:
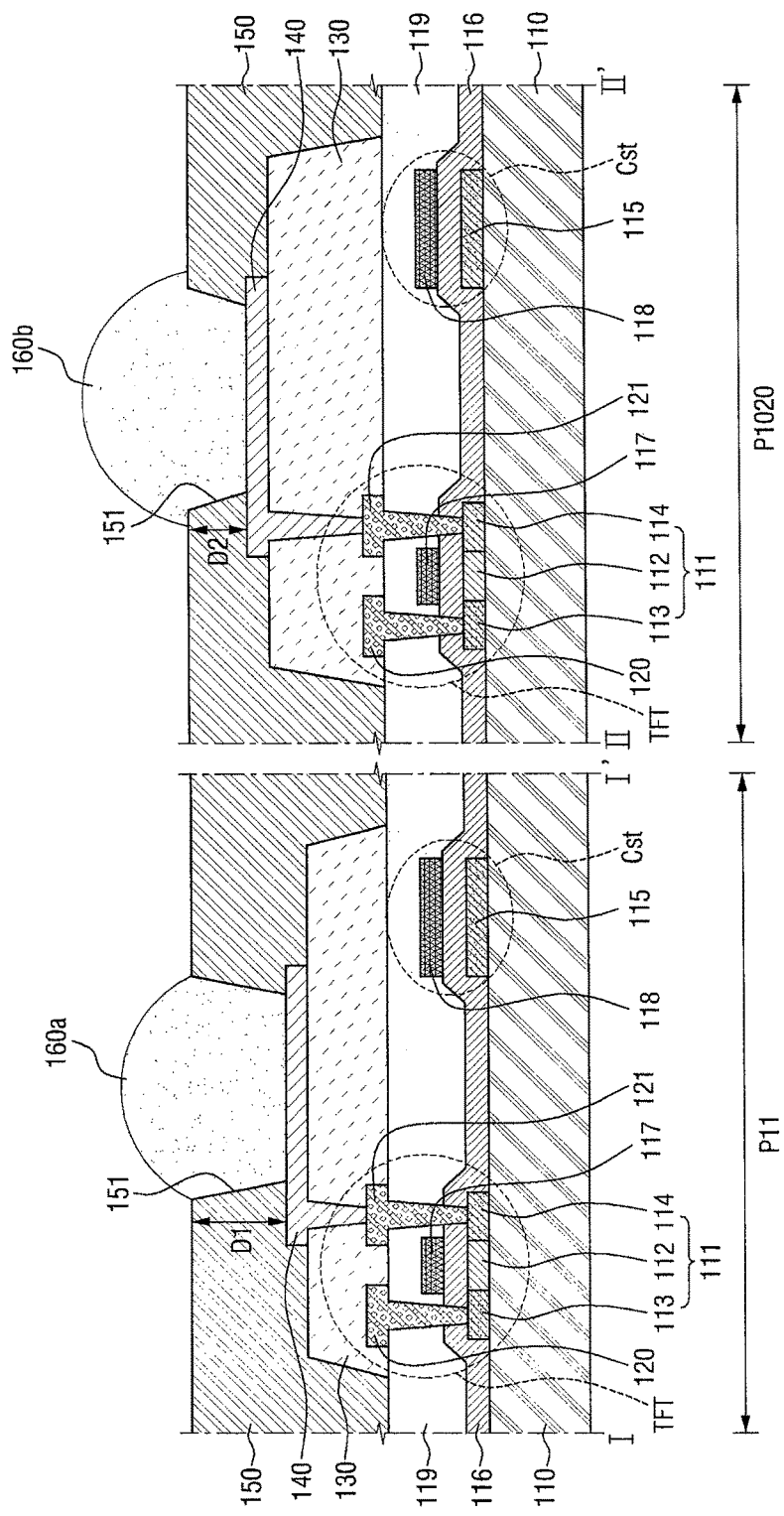

FIG. 11 illustrates that the organic light emitting ink 160a that is discharged into the opening 151 of the pixel defining layer 150 of the pixel P1020 is not spread to an upper surface portion of the pixel defining layer 150. However, as illustrated in FIG. 13, the organic light emitting ink 160a that is discharged into the opening 151 of the pixel defining layer 150 of the pixel P1020 may be spread to the upper surface portion of the pixel defining layer 150 with a width (e.g., a predetermined width).

Further, although not illustrated, after the amount of the organic material ink (e.g., the predetermined amount of the organic material ink or organic light emitting ink) is discharged into the opening 151 of the pixel defining layer 150 of each of the pixels P (e.g., see FIG. 1) using the discharge head (not illustrated) having a plurality of nozzles, the organic material ink may be dried at the same or substantially the same time through a separate drying process in a separate drying chamber at a vacuum atmosphere.

Figure 14:
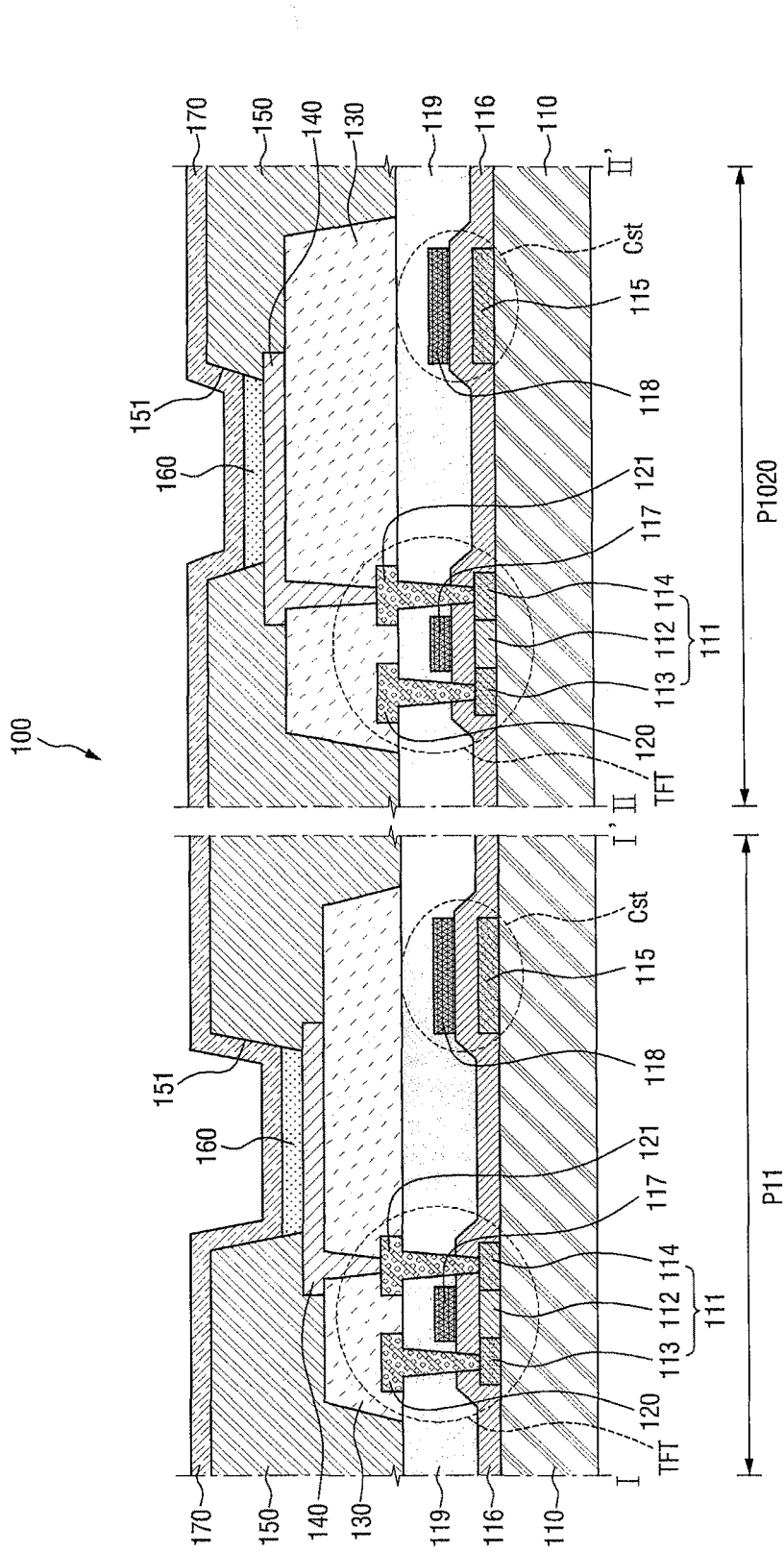

Then, as illustrated in FIG. 14, a second electrode 170 is formed on the organic layer 160. The second electrode 170 may be formed by depositing a transparent electrode material or a reflective material on the organic layer 160 through a deposition method.

Next, a light emitting display device 200 according to another embodiment of the present invention will be described.

Figure 15:
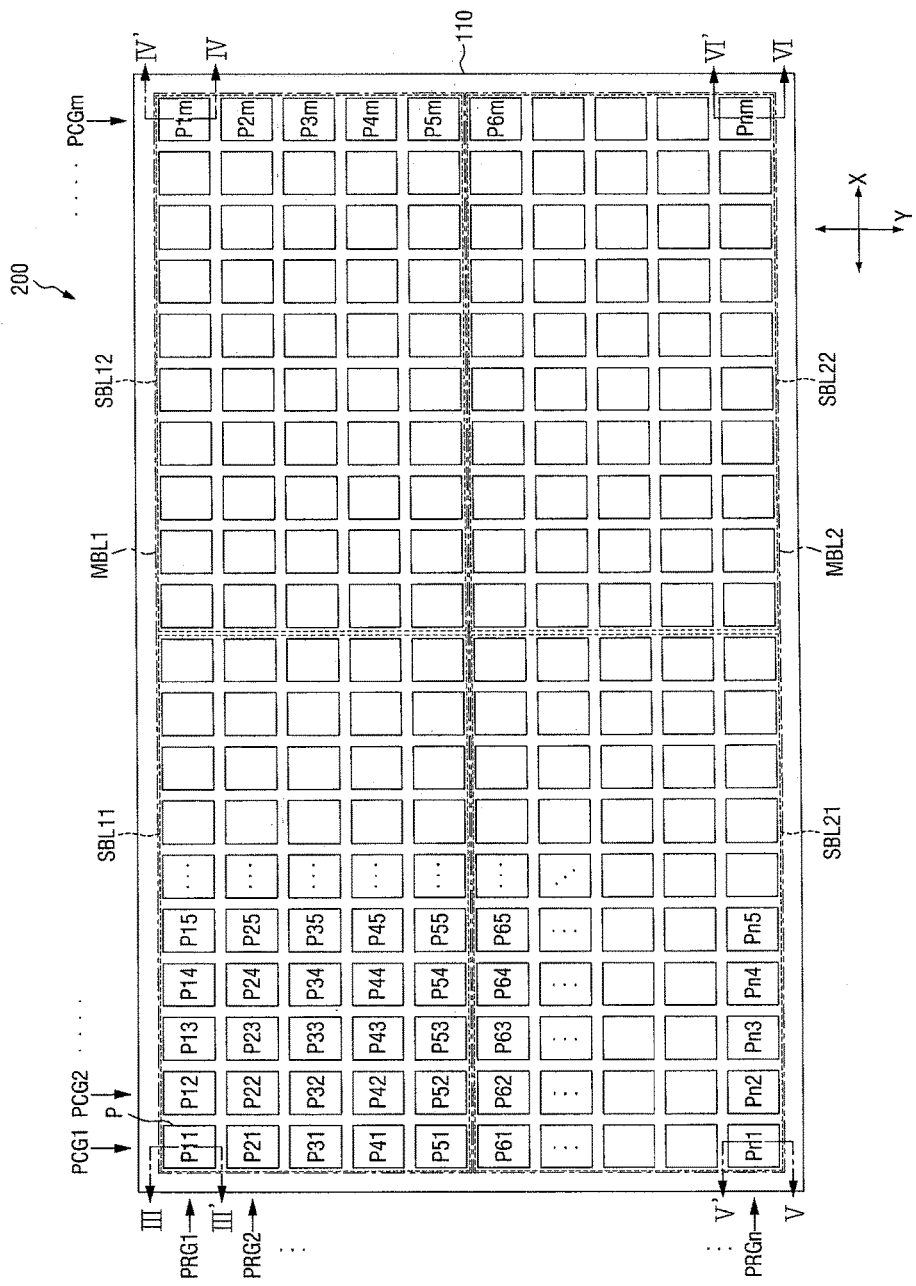
FIG. 15 is a schematic plan view illustrating pixels of a light emitting display device according to another embodiment of the present invention.

FIG. 15 is a schematic plan view illustrating pixels of a light emitting display device according to another embodiment of the present invention.

Referring to FIG. 15, a light emitting display device 200 according to another embodiment of the present invention includes a plurality of pixels P arranged on a substrate 110 in the form of an n×m (where, n and m are natural numbers) matrix, i.e., in a first direction X and a second direction Y that crosses the first direction X.

The plurality of pixels P may be divided into a plurality of row groups arranged in the second direction Y on the substrate 110. The plurality of row groups may include first to n-th pixel row groups PRG1 to PRGn, and may be divided into a plurality of main pixel blocks, for example, a first main pixel block MBL1 and a second main pixel block MBL2.

The first main pixel block MBL1 may include, for example, first to fifth pixel row groups PRG1 (P11 to P1$m$) to PRG5 (P51 to P5$m$), and the second main pixel block MBL2 may include, for example, sixth to tenth pixel row groups PRG6 (P61 to P6$m$) to PRG10 (P101 to P10$m$) (PRGn in FIG. 15).

FIG. 15 illustrates that the plurality of pixels P are arranged in the form of a 10×20 matrix and include 10 row groups, but are not limited thereto. Further, FIG. 1 illustrates that the number of main pixel blocks is 2, but is not limited thereto.

Further, the plurality of main pixel blocks may be further divided into a plurality of sub-pixel blocks. For example, the first main pixel block MBL1 may include a first sub-pixel block SBL11 that includes first to tenth pixel column groups PCG1 (P11 to P51) to PCG10 (P1.10 to P510) among the first to fifth pixel row groups PRG1 (P11 to P1$m$) to PRG5 (P51 to P5$m$), and a second sub-pixel block SBL12 that includes eleventh to twentieth pixel column groups PCG11 (P111 to P511) to PCG20 (P120 to P520) among the first to fifth pixel row groups PRG1 (P11 to P1$m$) to PRG5 (P51 to P5$m$). Further, the second main pixel block MBL2 may include a third sub-pixel block SBL21 that includes first to tenth pixel column groups PCG1 (P11 to P51) to PCG10 (P110 to P510) among the sixth to tenth pixel row groups PRG6 (P61 to P6$m$) to PRG10 (P101 to P10$m$), and a fourth sub-pixel block SBL22 that includes eleventh to twentieth pixel column groups PCG11 (P111 to P511) to PCG20 (P120 to P520) among the sixth to tenth pixel row groups PRG6 (P61 to P6$m$) to PRG10 (P101 to P10$m$).

FIG. 15 illustrates that the number of sub-pixel blocks is 4, but is not limited thereto. Further, FIG. 15 illustrates that a third number of successive pixel column groups that are included in the first sub-pixel block SBL11 is equal or substantially equal to a fourth number of successive pixel column groups that are included in the second sub-pixel block SBL12 in the first main pixel block MBL1, but is not limited thereto. For example, the third number and the fourth number may be different from each other, and the fourth number may be smaller than the third number. Further, FIG. 15 illustrates that a fifth number of successive pixel column groups that are included in the third sub-pixel block SBL21 is equal or substantially equal to a sixth number of successive pixel column groups that are included in the fourth sub-pixel block SBL22 in the second main pixel block MBL2, but is not limited thereto. For example, the fifth number and the sixth number may be different from each other, and the sixth number may be smaller than the fifth number.

Next, the structure of the light emitting display device 200 will be described in detail. In describing the structure of the light emitting display device 200, a pixel portion P that is included in the first sub-pixel block SBL11, a pixel portion P that is included in the second sub-pixel block SBL12, a pixel portion P that is included in the third sub-pixel block SBL21, and a pixel portion P that is included in the fourth sub-pixel block SBL22 among the plurality of pixels P will be exemplified. Here, the pixel portion P that is included in the first sub-pixel block SBL11 is exemplified as a pixel portion P11, the pixel portion P that is included in the second sub-pixel block SBL12 is exemplified as a pixel portion P120 (P1m in FIG. 15), the pixel portion P that is included in the third sub-pixel block SBL21 is exemplified as a pixel portion P101 (Pn1 in FIG. 15), and the pixel portion P that is included in the fourth sub-pixel block SBL22 is exemplified as a pixel portion P1020 (Pnm in FIG. 15).

Figure 16:
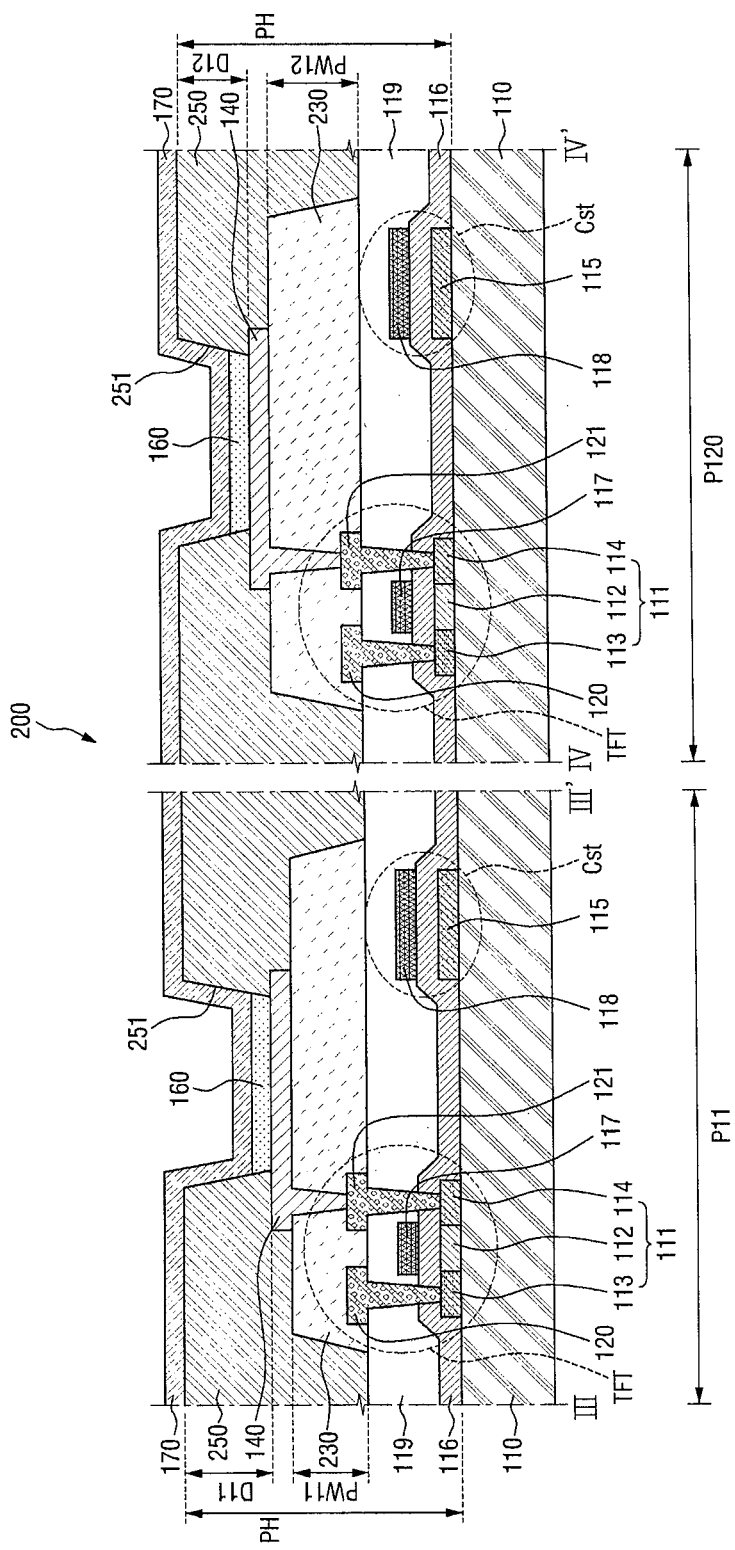
FIG. 16 is a cross-sectional view of a portion that is taken along line in a pixel that is included in a first sub-block and a portion that is taken along line IV-IV' in a pixel that is included in a second sub-block in FIG. 15.
Figure 17:
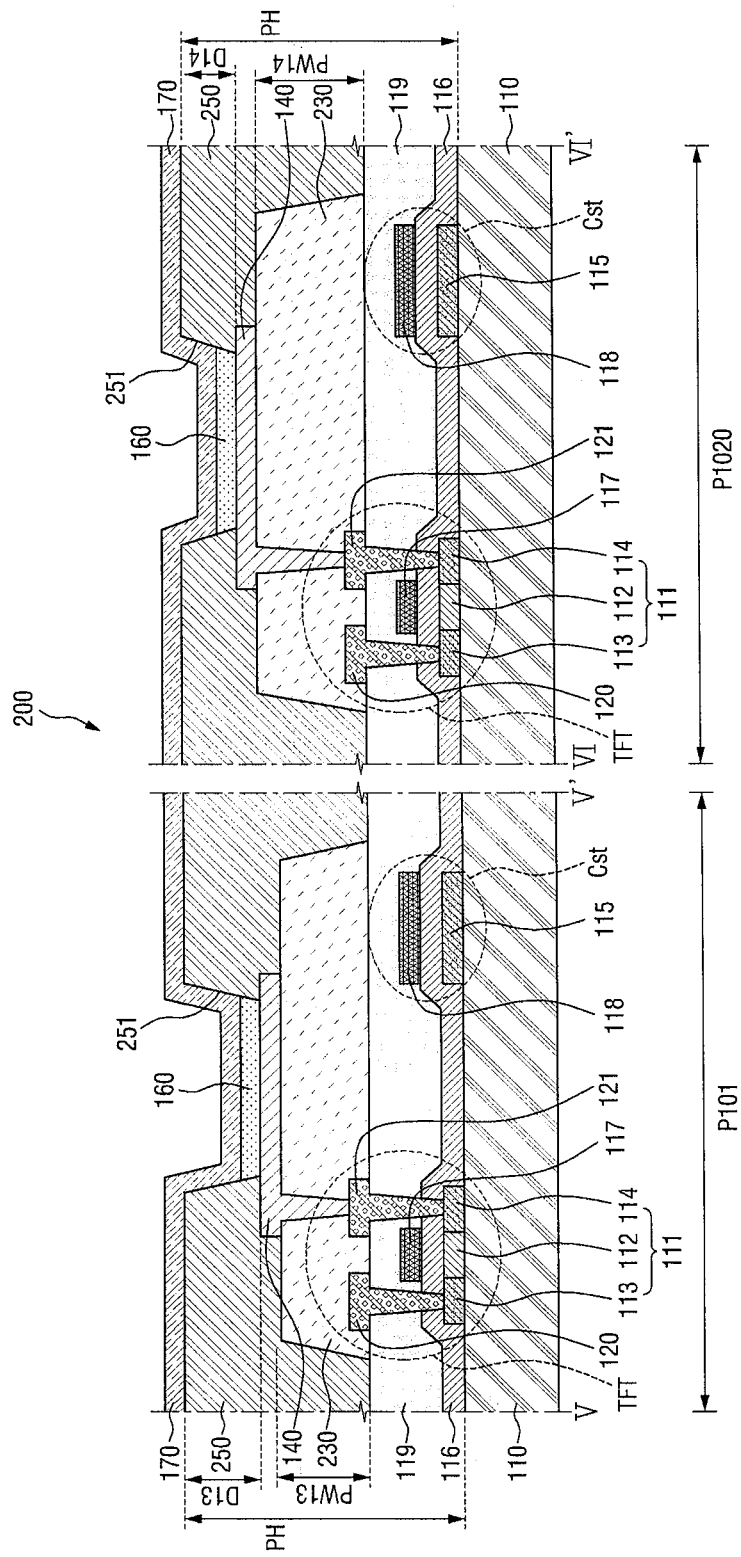
FIG. 17 is a cross-sectional view of a portion that is taken along line V-V' in a pixel that is included in a third sub-block and a portion that is taken along line VI-VI' in a pixel that is included in a fourth sub-block in FIG. 15.
Figure 18:
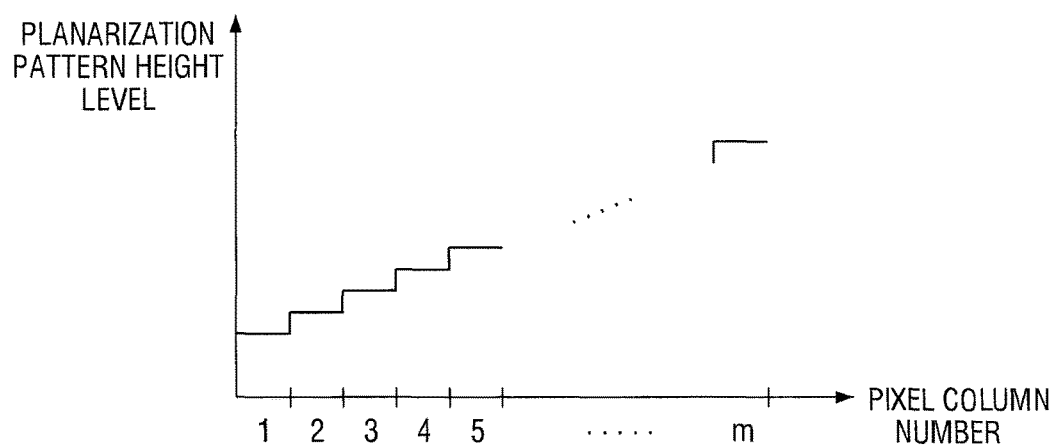
FIGS. 18 through 20 are exemplary diagrams illustrating planarization pattern height levels according to pixel column numbers.
Figure 19:
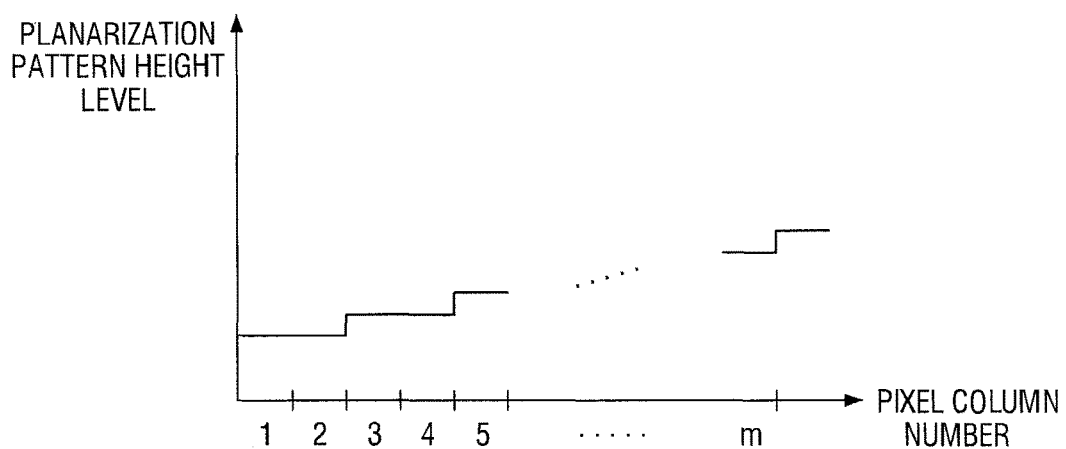
Figure 20:
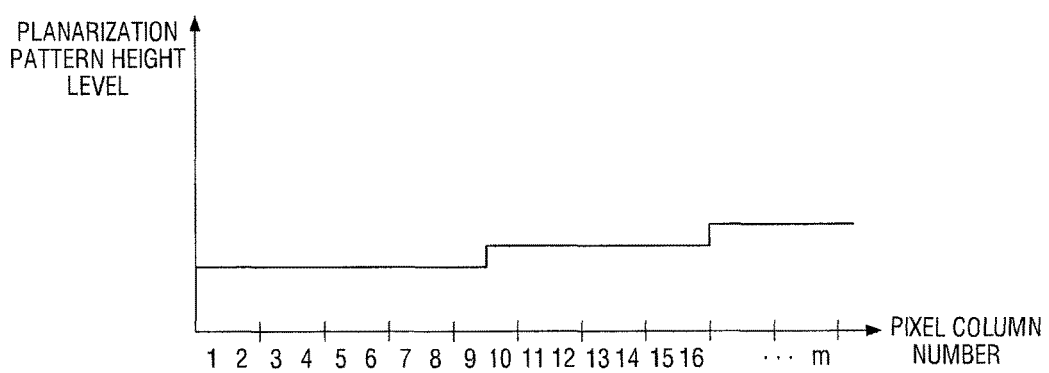

FIG. 16 is a cross-sectional view of a portion that is taken along line III-III' in a pixel that is included in a first sub-block and a portion that is taken along line IV-IV' in a pixel that is included in a second sub-block in FIG. 15, and FIG. 17 is a cross-sectional view of a portion that is taken along line V-V' in a pixel that is included in a third sub-block and a portion that is taken along line VI-VI' in a pixel that is included in a fourth sub-block in FIG. 15. FIGS. 18 through 20 are exemplary diagrams illustrating planarization pattern height levels according to pixel column numbers.

Referring to FIGS. 16 and 17, the light emitting display device 200 may include a substrate 110, an active layer 111, a lower electrode 115, a gate insulating layer 116, a gate electrode 117, an upper electrode 118, an interlayer insulating layer 119, a source electrode 120, a drain electrode 121, a planarization pattern 230, a first electrode 140, a pixel defining layer 250, an organic layer 160, and a second electrode 170.

Because the substrate 110, the active layer 111, the lower electrode 115, the gate insulating layer 116, the gate electrode 117, the upper electrode 118, the interlayer insulating layer 119, the source electrode 120, the drain electrode 121, the first electrode 140, the organic layer 160, and the second electrode 170 have been described in detail, the duplicate explanation thereof will be omitted.

The planarization pattern 230 is similar to the planarization pattern 130 illustrated in FIGS. 2 and 3. However, in the first main pixel block MBL1, a first thickness PW11 of the planarization pattern 230 of a pixel P11 that is included in the first sub-pixel block SBL11 may be different from a second thickness PW12 of the planarization pattern 230 of a pixel P120 that is included in the second sub-pixel block SBL12. For example, the second thickness PW12 of the planarization pattern 230 of the pixel P120 may be larger than the first thickness PW11 of the planarization pattern 230 of the pixel P11. Further, in the second main pixel block MBL2, a third thickness PW13 of the planarization pattern 230 of a pixel P101 that is included in the second sub-pixel block SBL21 may be different from a fourth thickness PW14 of the planarization pattern 230 of a pixel P1020 that is included in the fourth sub-pixel block SBL22. For example, the fourth thickness PW14 of the planarization pattern 230 of the pixel P1020 may be larger than the third thickness PW13 of the planarization pattern 230 of the pixel P101. The third thickness PW13 of the planarization pattern 230 of the pixel P101 may be larger than the second thickness PW12 of the planarization pattern 230 of the pixel P120.

The planarization pattern 230 may be formed so that a first depth D11 of an opening 251 of the pixel defining layer 250 of the pixel P11, a second depth D12 of an opening 251 of the pixel defining layer 250 of the pixel P120, a third depth D13 of an opening 251 of the pixel defining layer 250 of the pixel P101, and a fourth depth D14 of an opening 251 of the pixel defining layer 250 of the pixel P1020 are different from one another when the pixel defining layer 250 is formed so that heights PH measured from an upper surface of the substrate 110 to an upper surface of the pixel defining layer 250 in the pixels P11, P120, P101, and P1020 become equal or substantially equal to one another. For example, the planarization pattern 230 may be formed so that the fourth depth D14 of the opening 251 of the pixel defining layer 250 of the pixel P1020 becomes lower than the third depth D13 of the opening 251 of the pixel defining layer 250 of the pixel P101, the third depth D13 of the opening 251 of the pixel defining layer 250 of the pixel P101 becomes lower than the second depth D12 of the opening 251 of the pixel defining layer 250 of the pixel P120, and the second depth D12 of the opening 251 of the pixel defining layer 250 of the pixel P120 becomes lower than the first depth D11 of the opening 251 of the pixel defining layer 250 of the pixel P11.

The planarization pattern 230 having the different thicknesses in the pixels P11, P120, P101, and P1020 may be formed through a photolithography process using a half-tone mask. In some embodiments, the planarization pattern 230 having the different thicknesses in the pixels P11, P120, P101, and P1020 may be formed through a photolithography process using a digital exposure unit that facilitates adjustment of the exposure value without a mask. The planarization pattern 230 may be formed to include a photosensitive material, for example, a negative type photosensitive material.

As described above, when the first depth D11 of the opening 251 of the pixel defining layer 250 of the pixel P11, the second depth D12 of the opening 251 of the pixel defining layer 250 of the pixel P120, the third depth D13 of the opening 251 of the pixel defining layer 250 of the pixel P101, and the fourth depth D14 of the opening 251 of the pixel defining layer 250 of the pixel P1020 are different from one another, the surface area of ink that is discharged into the opening 251 of the pixel defining layer 250 of the pixel P11, the surface area of ink that is discharged into the opening 251 of the pixel defining layer 250 of the pixel P120, the surface area of ink that is discharged into the opening 251 of the pixel defining layer 250 of the pixel P101, and the surface area of ink that is discharged into the opening 251 of the pixel defining layer 250 of the pixel P1020 may be different from one another when a thin film is formed through discharging of the ink into the opening 251 of the pixel defining layer 250. The drying speed of the ink that is discharged into the opening 251 of the pixel defining layer 250 of the pixel P11, the drying speed of the ink that is discharged into the opening 251 of the pixel defining layer 250 of the pixel P120, the drying speed of the ink that is discharged into the opening 251 of the pixel defining layer 250 of the pixel P101, and the drying speed of the ink that is discharged into the opening 251 of the pixel defining layer 250 of the pixel P1020 may be different from one another. For example, when the fourth depth D14 of the opening 251 of the pixel defining layer 250 of the pixel P1020 is lower than the third depth D13 of the opening 251 of the pixel defining layer 250 of the pixel P101, the third depth D13 of the opening 251 of the pixel defining layer 250 of the pixel P101 is lower than the second depth D12 of the opening 251 of the pixel defining layer 250 of the pixel P120, and the second depth D12 of the opening 251 of the pixel defining layer 250 of the pixel P120 is lower than the first depth D11 of the opening 251 of the pixel defining layer 250 of the pixel P11, the surface area of the ink that is discharged into the opening 251 of the pixel defining layer 250 of the pixel P1020 may become larger than the surface area of the ink that is discharge into the opening 251 of the pixel defining layer 250 of the pixel P101, the surface area of the ink that is discharge into the opening 251 of the pixel defining layer 250 of the pixel P101 may become larger than the surface area of the ink that is discharged into the opening 251 of the pixel defining layer 250 of the pixel P120, and the surface area of the ink that is discharged into the opening 251 of the pixel defining layer 250 of the pixel P120 may become larger than the surface area of the ink that is discharged into the opening 251 of the pixel defining layer 250 of the pixel P11 when the thin film is formed through discharging of the ink into the opening 251 of the pixel defining layer 250. The drying speed of the ink that is discharged into the opening 251 of the pixel defining layer 250 of the pixel P1020 may be higher than the drying speed of the ink that is discharged into the opening 251 of the pixel defining layer 250 of the pixel P101, the drying speed of the ink that is discharged into the opening 251 of the pixel defining layer 250 of the pixel P101 may be higher than the drying speed of the ink that is discharged into the opening 251 of the pixel defining layer 250 of the pixel P120, and the drying speed of the ink that is discharged into the opening 251 of the pixel defining layer 250 of the pixel P120 may be higher than the drying speed of the ink that is discharged into the opening 251 of the pixel defining layer 250 of the pixel P11.

Accordingly, in the case where the time point when the ink is discharged onto the pixel P11, the time point when the ink is discharged onto the pixel P120, the time point when the ink is discharged onto the pixel P101, and the time point when the ink is discharged onto the pixel P1020 are different from one another, the drying rate of the ink (actually, the drying rate of a solvent included in the ink) that is discharged onto the pixel P11 for a time (e.g., a predetermined time), the drying rate of the ink that is discharged onto the pixel P120, the drying rate of the ink that is discharged onto the pixel P101, and the drying rate of the ink that is discharged onto the pixel P1020 may be adjusted to become equal, substantially equal, or similar to one another through differently adjusting the drying speed of the ink that is discharged onto the pixel P11, the drying speed of the ink that is discharged onto the pixel P120, the drying speed of the ink that is discharged onto the pixel P101, and the drying speed of the ink that is discharged onto the pixel P1020. The time (e.g., the predetermined time) may be a time that is measured from a time point when the ink is first discharged into the opening 251 of the pixel defining layer 250 using an inkjet or nozzle printing method to a time point just before a separate drying process is performed in a vacuum atmosphere through a time point when the ink is finally discharged. For example, when the time point when the ink is discharged onto the pixel P11 is earlier than the time point when the ink is discharged onto the pixel P120, the time point when the ink is discharged onto the pixel P120 is earlier than the time point when the ink is discharged onto the pixel P101, and the time point when the ink is discharged onto the pixel P101 is earlier than the time point when the ink is discharged onto the pixel P1020, the drying rate of the ink (actually, the drying rate of a solvent included in the ink) that is discharged onto the pixel P11 for the time (e.g., the predetermined time), the drying rate of the ink that is discharged onto the pixel P120, the drying rate of the ink that is discharged onto the pixel P101, and the drying rate of the ink that is discharged onto the pixel P1020 may be adjusted to become equal, substantially equal, or similar to one another through adjusting the drying speed of the ink that is discharged onto the pixel P1020 to be higher than the drying speed of the ink that is discharged onto the pixel P101, adjusting the drying speed of the ink that is discharged onto the pixel P101 to be higher than the drying speed of the ink that is discharged onto the pixel P120, and adjusting the drying speed of the ink that is discharged onto the pixel P120 to be higher than the drying speed of the ink that is discharged onto the pixel P11. Here, the drying of the ink before the separate drying process may be natural drying.

Accordingly, because the thickness of the thin film (e.g., organic layer 160) that is formed through drying of the ink for the pixels P becomes uniform, the light emission characteristics also become uniform, and thus the display quality of the light emitting display device is improved.

FIG. 15 illustrates that 10 pixel column groups are respectively included in the first sub-pixel block SBL11 and the third sub-pixel block SBL21, and 10 pixel column groups are respectively included in the second sub-pixel block SBL12 and the fourth sub-pixel block SBL22, and it is described that the planarization pattern 230 has four height levels in FIGS. 16 and 17. However, the planarization pattern 230 may have a different number of height levels through differently setting the number of sub-pixel blocks or the number of pixel column groups that are included in the sub-pixel blocks.

For example, when the number of sub-pixel blocks is equal or substantially equal to the number of pixel column groups in the same or substantially the same main pixel block, the planarization pattern may be formed in a manner that as the pixel column number is increased, the height level of the planarization pattern is also increased as illustrated in FIG. 18. That is, the number of height levels of the planarization pattern may be equal or substantially equal to the number of pixel column groups. In forming the organic layer using an inkjet or nozzle printing method, the drying speed according to the discharge time point of the organic light emitting ink may be minutely adjusted. Here, as the pixel column number becomes larger, the discharge time of the organic light emitting ink may be later in time.

Further, when two or more pixel column groups are included in each of the plurality of sub-pixel blocks in the same or substantially the same main pixel block, the planarization pattern may be formed in a manner that as the pixel column number is increased, the height level of the planarization pattern is also increased in the unit of two or more pixel column groups as illustrated in FIG. 19. In this way, the process of forming a planarization pattern may be facilitated. Here, as the pixel column number becomes larger, the discharge time of the organic light emitting ink may be later for pixels in the same or substantially the same main pixel block.

Further, when different numbers of pixel column groups are respectively included in the plurality of sub-pixel blocks in the same or substantially the same main pixel block, the planarization pattern may be formed in a manner that as the pixel column number is increased, the height level of the planarization pattern is also increased in the unit of irregular numbers of pixel column groups as illustrated in FIG. 20. For example, when the first sub-pixel block includes first to ninth pixel column groups, the second sub-pixel block includes tenth to sixteenth pixel column groups, and the third sub-pixel block includes seventeenth to twentieth pixel column groups, the planarization pattern may be formed in a manner that the height levels of the planarization pattern are increased in the unit of nine pixel column groups, seven pixel column groups, and four pixel column groups in the same or substantially the same main pixel block. In this way, the process of forming a planarization pattern may be facilitated, and the height levels of the planarization pattern may be minutely divided with respect to the sub-pixel blocks that include pixel column groups of which the drying speeds of the organic light emitting ink are greatly different from each other in the same or substantially the same main block. Here, as the pixel column number becomes larger in the same or substantially the same main pixel block, the discharge time of the organic light emitting ink may be later in time. The sub-pixel block that includes pixel column groups of which the drying speeds of the organic light emitting ink are greatly different from each other in the same or substantially the same main pixel block may be a sub-pixel group that includes a small number of pixel column groups.

The pixel defining layer 250 is similar to the pixel defining layer 150 of FIG. 3. However, the opening 251 of the pixel defining layer 250 is formed to have a first depth D11 on the pixel P11, a second depth D12 that is lower than the first depth D11 on the pixel P120, a third depth D13 that is lower than the second depth D12 on the pixel 101, and a fourth depth D14 that is lower than the third depth D13 on the pixel P1020.

As described above, the light emitting display device 200 according to another embodiment of the present invention includes the planarization pattern 230 having different thicknesses for the sub-pixel blocks, and thus the openings 251 of the pixel defining layer 250 for the respective sub-pixel blocks may have different depths.

Accordingly, the surface areas of the ink that is discharged into the openings 251 of the pixel defining layer 250 are different from each other for the respective sub-pixel blocks, and thus the drying rates of the ink are kept equal, substantially equal, or similar to each other for the respective sub-pixel blocks even when the ink drying times are different from each other due to the different ink discharge times for the respective sub-pixel blocks.

Accordingly, the thickness of the organic layer 160 that is formed through drying of the ink for the respective pixels becomes uniform, and thus the light emission characteristics also become uniform to improve the display quality of the light emitting display device.

According to another embodiment of the present invention, the division of the plurality of pixels P into the first sub-pixel block SBL11, the second sub-pixel block SBL12, the third sub-pixel block SBL21, and the fourth sub-pixel block SBL22 may be caused by the division of the difference between the drying speeds of the ink that is discharged into the opening 251 of the pixel defining layer 250 briefly into four levels for the plurality of pixels P, and the number of sub-pixel blocks may differ depending on the number of levels into which the difference between the ink drying speeds is divided.

Because a method for manufacturing a light emitting display device 200 according to another embodiment of the present invention is similar to the method for manufacturing a light emitting display device 100 as described above with reference to FIGS. 7 through 14, the duplicate explanation thereof will be omitted.

Next, a light emitting display device 300 according to still another embodiment of the present invention will be described.

The light emitting display device 300 according to still another embodiment of the present invention has the same or substantially the same configuration as the configuration of the light emitting display device 100 except for a planarization pattern 330 and a pixel defining layer 350. Accordingly, the light emitting display device 300 according to still another embodiment of the present invention will be described around the planarization pattern 330 and the pixel defining layer 350.

Figure 21:
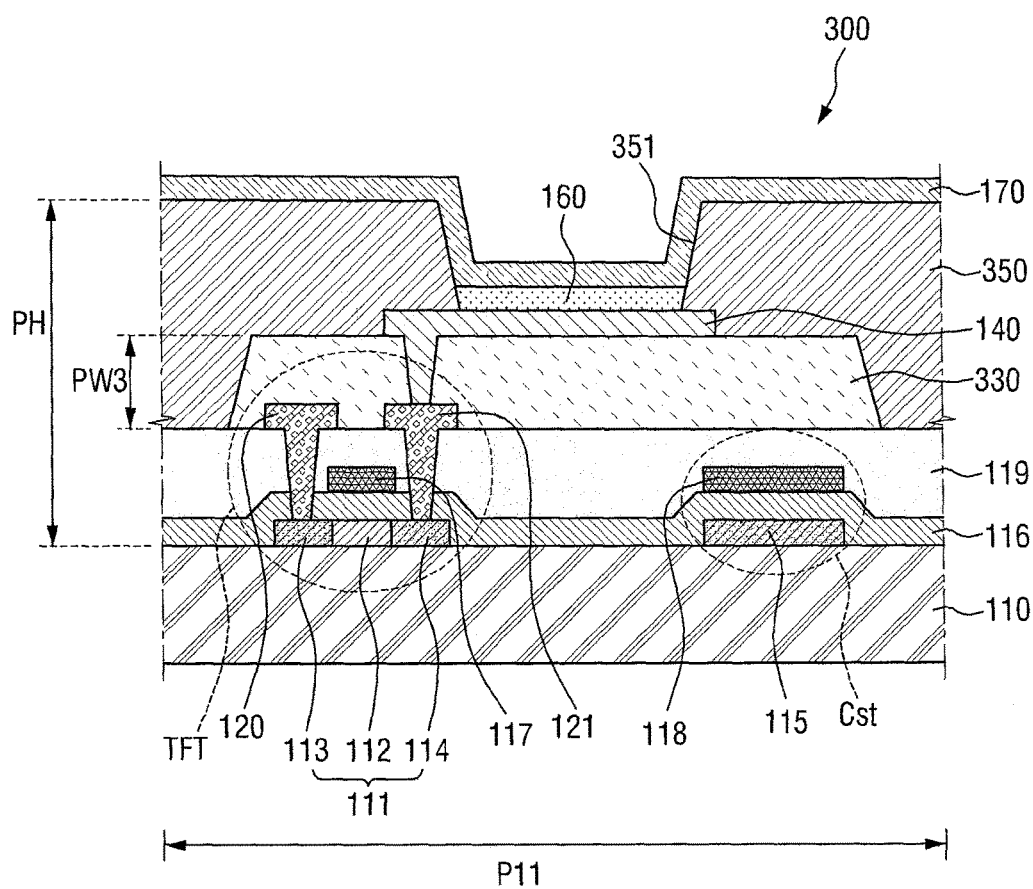
FIG. 21 is a cross-sectional view of a portion that corresponds to the portion of FIG. 2 in a light emitting display device according to still another embodiment of the present invention.
Figure 22:
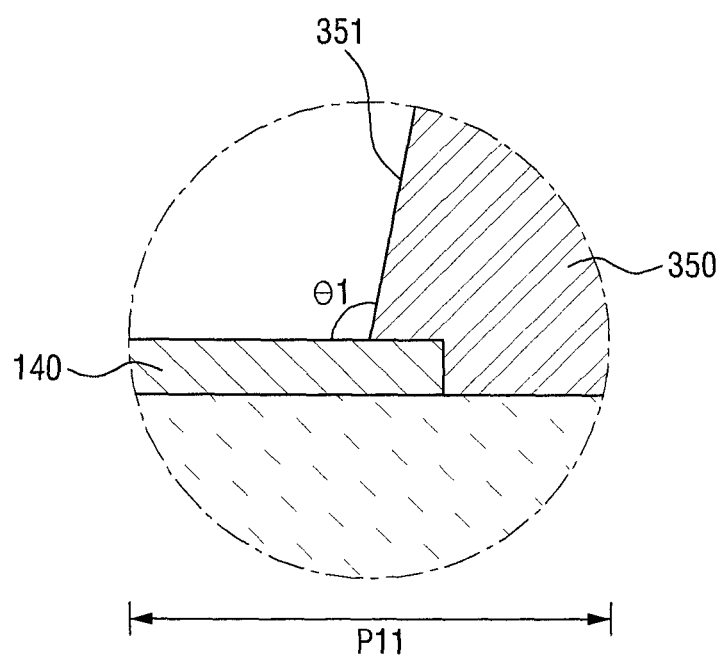
FIG. 22 is a cross-sectional view illustrating the relationship between a first electrode and a pixel defining layer of FIG. 21.
Figure 23:
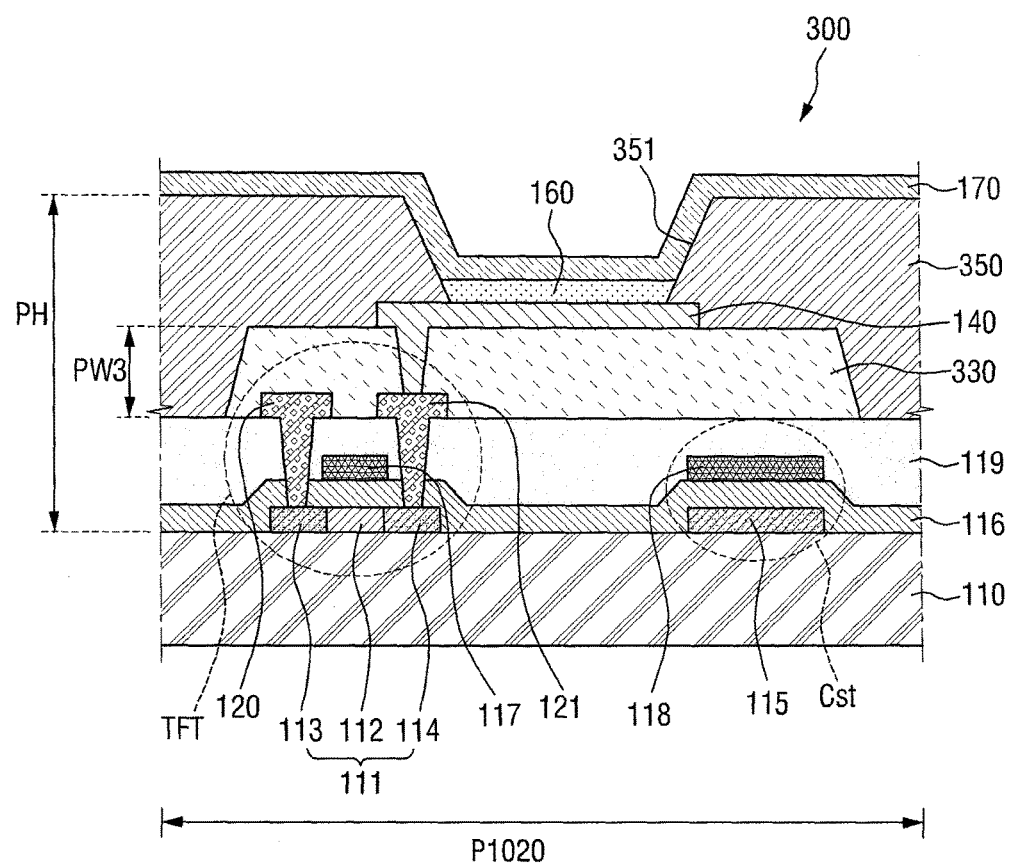
FIG. 23 is a cross-sectional view of a portion that corresponds to the portion of FIG. 3 in a light emitting display device according to still another embodiment of the present invention.
Figure 24:
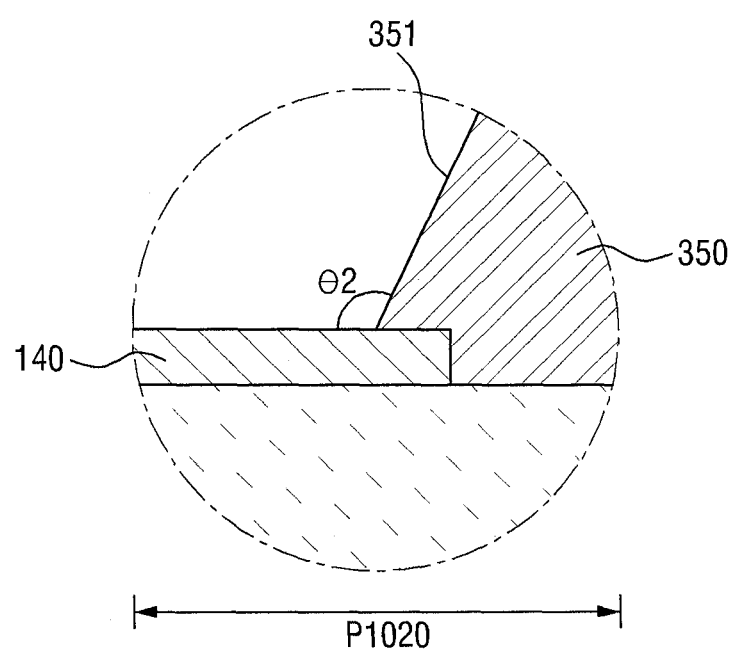
FIG. 24 is a cross-sectional view illustrating the relationship between a first electrode and a pixel defining layer of FIG. 23.

FIG. 21 is a cross-sectional view of a portion that corresponds to the portion of FIG. 2 in a light emitting display device according to still another embodiment of the present invention, and FIG. 22 is a cross-sectional view illustrating the relationship between a first electrode and a pixel defining layer of FIG. 21. FIG. 23 is a cross-sectional view of a portion that corresponds to the portion of FIG. 3 in a light emitting display device according to still another embodiment of the present invention, and FIG. 24 is a cross-sectional view illustrating the relationship between a first electrode and a pixel defining layer of FIG. 23.

Referring to FIGS. 21 through 24, the light emitting display device 300 according to still another embodiment of the present invention may include a substrate 110, an active layer 111, a lower electrode 115, a gate insulating layer 116, a gate electrode 117, an upper electrode 118, an interlayer insulating layer 119, a source electrode 120, a drain electrode 121, a planarization pattern 330, a first electrode 140, a pixel defining layer 350, an organic layer 160, and a second electrode 170.

The planarization pattern 330 is similar to the planarization pattern 130 illustrated in FIGS. 2 and 3. However, the planarization pattern 330 has the same or substantially the same thickness PW3 on both a pixel P11 that is included in the first main pixel block MBL1 and a pixel P1020 that is included in the second main pixel block MBL2. The planarization pattern 330 may be formed to include an organic material, a positive photosensitive material, or a negative photosensitive material. The planarization pattern 330 may be formed through a photolithography process using a mask or a photolithography process using a digital exposure unit without a mask.

The pixel defining layer 350 is similar to the pixel defining layer 150 of FIGS. 2 and 3. However, the pixel defining layer 350 may be formed so that a first angle θ1 that is formed between an inner wall of an opening 351 and the first electrode 140 in a pixel P11 included in a first main pixel block MBL1 is different from a second angle θ2 that is formed between an inner wall of an opening 351 and the first electrode 140 in a pixel P1020 included in a second main pixel block MBL2. For example, the second angle θ2 that is formed between the inner wall of the opening 351 and the first electrode 140 in the pixel P1020 may be larger than the first angle θ1 that is formed between the inner wall of the opening 351 and the first electrode 140 in the pixel P11.

The pixel defining layer 350 may be formed so that an area of an upper portion of the opening 351 of the pixel defining layer 350 of the pixel P11 becomes different from an area of an upper portion of the opening 351 of the pixel defining layer 350 of the pixel P1020 when the pixel defining layer 350 is formed so that heights PH measured from an upper surface of the substrate 110 to an upper surface of the pixel defining layer 350 become equal or substantially equal to each other in the pixels P11 and P1020. For example, the pixel defining layer 350 may be formed so that the area of the upper portion of the opening 351 of the pixel defining layer of the pixel P1020 becomes larger than the area of the upper portion of the opening 351 of the pixel defining layer when the pixel defining layer 350 is formed so that the heights PH measured from the upper surface of the substrate 110 to the upper surface of the pixel defining layer 350 in the pixels P11 and P1020 become equal or substantially equal to each other.

The pixel defining layer 350 having different areas of the upper portion of the opening 351 in the pixels P11 and P1020 may be formed through a photolithography process using a mask. In some embodiments, the pixel defining layer 350 having different areas of the upper portion of the opening 351 in the pixels P11 and P1020 may be formed through a photolithography process using a digital exposure unit that facilitates adjustment of the exposure value without a mask. The pixel defining layer 350 may be formed to include an organic material, a positive type photosensitive material, or a negative type photosensitive material.

As described above, when the area of the upper portion of the opening 351 of the pixel defining layer 350 of the pixel P11 is different from the area of the upper portion of the opening 351 of the pixel defining layer 350 of the pixel P1020, the surface area of ink that is discharged into the opening 351 of the pixel defining layer 350 of the pixel P11 may be different from the surface area of ink that is discharged into the opening 351 of the pixel defining layer 350 of the pixel P1020 when a thin film is formed through discharging of the ink into the opening 351 of the pixel defining layer 350. The drying speed of the ink that is discharged into the opening 351 of the pixel defining layer 350 of the pixel P11 may be different from the drying speed of the ink that is discharged into the opening 351 of the pixel defining layer 350 of the pixel P1020. For example, when the area of the upper portion of the opening 351 of the pixel defining layer 350 of the pixel P1020 that is included in the second main pixel block MBL2 is larger than the area of the upper portion of the opening 351 of the pixel defining layer 350 of the pixel P11 included in the first main pixel block MBL1, the surface area of the ink that is discharged into the opening 351 of the pixel defining layer 350 of the pixel P1020 may become larger than the surface area of the ink that is discharged into the opening 351 of the pixel defining layer 350 of the pixel P11 when the thin film is formed through discharging of the ink into the opening 351 of the pixel defining layer 350. The drying speed of the ink that is discharged into the opening 351 of the pixel defining layer 350 of the pixel P1020 may be higher than the drying speed of the ink that is discharged into the opening 351 of the pixel defining layer 350 of the pixel P11.

Accordingly, in the case where the time point when the ink is discharged onto the pixel P11 is different from the time point when the ink is discharged onto the pixel P1020, the drying rate of the ink (actually, the drying rate of a solvent included in the ink) that is discharged onto the pixel P11 for a time (e.g., a predetermined time) may be adjusted to become equal, substantially equal, or similar to the drying rate of the ink that is discharged onto the pixel P1020 through differently adjusting the drying speed of the ink that is discharged onto the pixel P11 and the drying speed of the ink that is discharged onto the pixel P1020. The time (e.g., the predetermined time) may be time that is measured from a time point when the ink is first discharged into the opening 351 of the pixel defining layer 350 using an inkjet or nozzle printing method to a time point just before a separate drying process is performed in a vacuum atmosphere through a time point when the ink is finally discharged. For example, when the time point when the ink is discharged onto the pixel P11 is earlier than the time point when the ink is discharged onto the pixel P1020, the drying rate of the ink that is discharged onto the pixel P11 for the time (e.g., the predetermined time) may be adjusted to become equal, substantially equal, or similar to the drying rate of the ink that is discharged onto the pixel P1020 through adjusting the drying speed of the ink that is discharged onto the pixel P1020 to be higher than the drying speed of the ink that is discharged onto the pixel P11. Here, the drying of the ink before the separate drying process may be natural drying.

Accordingly, because the thickness of the thin film (e.g., organic layer 160) that is formed through drying of the ink for the pixels P becomes uniform, the light emission characteristics also become uniform, and thus the display quality of the light emitting display device is improved.

Although not illustrated, the pixel defining layer 350 may be formed so that as the pixel row number is increased, the angle that is formed between the first electrode 140 and the inner wall of the opening 351 of the pixel defining layer 350 is increased in the method as illustrated in FIGS. 4 through 6.

As described above, the light emitting display device 300 according to still another embodiment of the present invention includes the pixel defining layer 350 having different angles formed between the first electrode 140 and the inner wall of the opening 351 for the main pixel blocks, and thus the upper portion of the opening 351 of the pixel defining layer 150 may have different areas for the main pixel blocks.

Accordingly, the surface areas of the ink that is discharged into the openings 351 of the pixel defining layer 350 are different from each other for the main pixel blocks, and thus the drying rates of the ink are kept equal, substantially equal, or similar to each other for the main pixel blocks even when the ink drying times are different from each other due to the different ink discharge times for the main pixel blocks.

Accordingly, the thickness of the organic layer 160 that is formed through drying of the ink for the respective pixels becomes uniform, and thus the light emission characteristics also become uniform to improve the display quality of the light emitting display device.

The method for manufacturing a light emitting display device 300 according to another embodiment of the present invention is similar to the method for manufacturing a light emitting display device 100 as described above with reference to FIGS. 7 through 14 except that the planarization pattern 130 has the same or substantially the same thickness in all pixels, and the angles formed between the inner wall of the opening 351 of the pixel defining layer 350 and the first electrode 140 are different from each other for the main pixel blocks.

Those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

Furthermore, to those skilled in the various arts, the invention itself herein will suggest solutions to other tasks and adaptations for other applications. It is the applicant's intention to cover by claims all such uses of the invention and those changes and modifications which could be made to the embodiments of the invention herein chosen for the purpose of disclosure without departing from the spirit and scope of the invention. Thus, the present embodiments of the invention should be considered in all respects as illustrative and not restrictive, the scope of the invention to be indicated by the appended claims and their equivalents.

What is claimed is:

1. A light emitting display device comprising:
a substrate comprising a plurality of pixels arranged in a first direction and a second direction that crosses the first direction, the plurality of pixels comprising a plurality of pixel row groups that are arranged in the second direction, a first main pixel block comprising a first number of consecutive ones of the pixel row groups, and a second main pixel block comprising a second number of consecutive ones of the pixel row groups;
a planarization pattern arranged on the substrate;
a first electrode on the planarization pattern for each of the plurality of pixels;
a pixel defining layer partitioning the respective pixels on the substrate and having an opening for exposing the first electrode;
an organic layer on the first electrode; and
a second electrode on the organic layer,
wherein a thickness of the planarization pattern of the pixel in the second main pixel block is larger than a thickness of the planarization pattern of the pixel in the first main pixel block.

2. The light emitting display device of claim 1, wherein heights measured from an upper surface of the substrate to an upper surface of the pixel defining layer are equal to each other in the pixel in the first main pixel block and the pixel in the second main pixel block.

3. The light emitting display device of claim 1, wherein a depth of the opening of the pixel defining layer in the pixel in the second main pixel block is lower than a depth of the opening of the pixel defining layer in the pixel in the first main pixel block.

4. The light emitting display device of claim 1, wherein a position of the organic layer in the pixel in the second main pixel block is higher than a position of the organic layer in the pixel in the first main pixel block.

5. The light emitting display device of claim 1, wherein the planarization pattern comprises a photosensitive material.

6. The light emitting display device of claim 1, wherein the first number is equal to the second number.

7. The light emitting display device of claim 1, wherein the second number is smaller than the first number.

8. The light emitting display device of claim 1, wherein the first main pixel block comprises:
a first sub-pixel block comprising a third number of consecutive ones of a plurality of pixel column groups among the first number of consecutive ones of the pixel row groups; and
a second sub-pixel block comprising a fourth number of consecutive ones of the pixel column groups among the first number of consecutive ones of the pixel row groups.

9. The light emitting display device of claim 8, wherein the third number is equal to the fourth number.

10. The light emitting display device of claim 8, wherein the fourth number is smaller than the third number.

11. The light emitting display device of claim 1, wherein the second main pixel block comprises:
a third sub-pixel block comprising a fifth number of consecutive ones of a plurality of pixel column groups among the second number of consecutive ones of the pixel row groups; and
a fourth sub-pixel block comprising a sixth number of consecutive ones of the pixel column groups among the second number of consecutive ones of the pixel row groups.

12. The light emitting display device of claim 11, wherein the fifth number is equal to the sixth number.

13. The light emitting display device of claim 11, wherein the sixth number is smaller than the fifth number.

14. A light emitting display device comprising:
a substrate comprising a plurality of pixels arranged in a first direction and a second direction that crosses the first direction, the plurality of pixels comprising a first main pixel block and a second main pixel block;
a planarization pattern arranged on the substrate;
a first electrode on the planarization pattern for each of the plurality of pixels;
a pixel defining layer partitioning the respective pixels on the substrate and having an opening for exposing the first electrode;
an organic layer on the first electrode; and
a second electrode on the organic layer,
wherein an angle between an inner wall of the opening of the pixel defining layer of the pixel in the second main pixel block and the first electrode is larger than an angle that is between the inner wall of the opening of the pixel defining layer of the pixel in the first main pixel block and the first electrode.

15. The light emitting display device of claim 14, wherein heights measured from an upper surface of the substrate to an upper surface of the pixel defining layer are equal to each other in the pixel in the first main pixel block and the pixel in the second main pixel block.

16. The light emitting display device of claim 14, wherein thicknesses of the planarization pattern are equal to each other in the pixel in the first main pixel block and the pixel in the second main pixel block.

17. The light emitting display device of claim 14, wherein an area of an upper portion of the opening of the pixel defining layer in the pixel in the second main pixel block is larger than an area of an upper portion of the opening of the pixel defining layer in the pixel in the first main pixel block.

18. The light emitting display device of claim 14, wherein the pixel defining layer comprises a photosensitive material.

19. The light emitting display device of claim 14, wherein the plurality of pixels comprises a plurality of row groups that are arranged in the second direction, and
wherein the first main pixel block comprises a first number of successive pixel row groups, and the second main pixel block comprises a second number of successive pixel row groups.

* * * * *